United States Patent
Urabe et al.

(10) Patent No.: US 11,107,936 B2
(45) Date of Patent: Aug. 31, 2021

(54) OUTPUT VOLTAGE CONTROL CIRCUIT DEVICE FOR PLURALITY OF POWER SUPPLY CELLS CONNECTED IN SERIES

(71) Applicants: Toyota Jidosha Kabushiki Kaisha, Toyota (JP); Tokyo Metropolitan University, Tokyo (JP)

(72) Inventors: Shinichi Urabe, Shizuoka-ken (JP); Kazuki Obata, Susono (JP); Toshihisa Shimizu, Fuchu (JP)

(73) Assignees: Toyota Jidosha Kabushiki Kaisha, Toyota (JP); Tokyo Metropolitan University, Tokyo (JP)

( * ) Notice: Subject to any disclaimer, the term of this patent is extended or adjusted under 35 U.S.C. 154(b) by 0 days.

(21) Appl. No.: 16/823,896

(22) Filed: Mar. 19, 2020

(65) Prior Publication Data

US 2020/0321482 A1 Oct. 8, 2020

(30) Foreign Application Priority Data

Apr. 4, 2019 (JP) .............................. JP2019-072310

(51) Int. Cl.
| | | |
|---|---|---|
| *H01L 31/0224* | (2006.01) | |
| *H01L 31/02* | (2006.01) | |
| *H02J 3/38* | (2006.01) | |
| *H01L 31/05* | (2014.01) | |

(52) U.S. Cl.
CPC ............. *H01L 31/022425* (2013.01); *H01L 31/02021* (2013.01); *H01L 31/05* (2013.01); *H02J 3/381* (2013.01); *H02J 2300/26* (2020.01)

(58) Field of Classification Search
CPC ....... H01L 31/022425; H01L 31/02021; H01L 31/05; H02J 3/381; H02J 300/26
See application file for complete search history.

(56) References Cited

U.S. PATENT DOCUMENTS

2018/0062392 A1   3/2018   Urabe et al.

FOREIGN PATENT DOCUMENTS

JP    2018-038245 A    3/2018

OTHER PUBLICATIONS

Shimizu, Toshihisa et al., "Improvement of the efficiency characteristics on the photovoltaic generation system based on a generation control circuit", Proceedings of Japan Solar Energy Association / Japan Wind Energy Association Joint Conference, 1996, p. 57-60.

(Continued)

*Primary Examiner* — Robert L Deberadinis
(74) *Attorney, Agent, or Firm* — Dinsmore & Shohl LLP

(57) ABSTRACT

An output voltage control circuit device includes a rectifying unit configured to permit a flow of a current from a negative electrode side to a positive electrode side of a power supply cell, a voltage generation unit, through which a current is able to flow in both directions between both ends inserted between a negative electrode of an odd-numbered power supply cell counted from the negative electrode side of the power supply cells and an anode of the rectifying unit, and a generated voltage between both ends is able to be cyclically inverted; a voltage holding capacitor, and a voltage control circuit unit configured to generate a voltage, a direction of which is cyclically inverted, between both ends of the voltage generation unit on the negative electrode side of the power supply cells.

16 Claims, 9 Drawing Sheets

(56) References Cited

OTHER PUBLICATIONS

Shimizu, Toshihisa, "Generation control circuitry for operating point normalization of photovoltaic modules", FB Technical News No. 56, Nov. 1, 2000, p. 22-27.
Shimizu, Toshihisa et al., "Generation control circuit for photovoltaic modules", IEEE Transactions on Power Electronics, vol. 16, No. 3, May 2001, p. 293-300.

OPERATION POINT CONTROL CIRCUIT

OUTPUT VOLTAGE CONTROL CIRCUIT DEVICE FOR PLURALITY OF POWER SUPPLY CELLS CONNECTED IN SERIES

CROSS-REFERENCE TO RELATED APPLICATION

This application claims priority to Japanese Patent Application No. 2019-072310 filed on Apr. 4, 2019, the disclosure of which is incorporated herein by reference in its entirety.

BACKGROUND

1. Technical Field

The present disclosure relates to an output voltage control circuit device for a plurality of power supply cells connected in series, especially, the present disclosure relates to a circuit device (output voltage control circuit device) that controls operation points of a plurality of solar cells or a plurality of other power supply cells (chemical cells, storage cells, fuel cells, power generators, thermoelectric elements, and the like) connected in series. In particular, the present disclosure relates to an output voltage control circuit device that controls operation voltages of solar cells or other power supply cells connected in series such that different currents can flow in the solar cells or other power supply cells.

2. Description of Related Art

In general, a generated voltage of one solar cell is lower than an operation voltage of each of various machines and instruments or a charger. For this reason, as one method for using a solar cell in operating the machines and instruments or charging the charger, a configuration (solar cell module) in which a plurality of solar cells is connected in series in a solar power generation system may be employed. However, in a solar cell module having a configuration in which the solar cells are simply connected in series, in a case where a shadow casts on a part of the cells due to a difference in installation angle of each solar cell, a building, or the like, and variation occurs in the amount of received light between the cells, the cell having a small amount of generated power may become a resistor (a diode in a reverse bias mode) to decrease an output of the solar cell module.

More specifically, referring to FIG. 9A, as well known in the field, in general, the solar cell has a generated voltage-current characteristic such that, in a state in which a certain amount of light is received, the generated voltage increases from 0 V to a certain value and a current (fine solid line $I_{100}$ to $I_{25}$) is gradually reduced, and in a case where the generated voltage further increases, the current is rapidly reduced. Thus, the generated power has an optimum operation point x (referred to as a maximum power point or an optimum operation point) at which the magnitude of the generated power becomes maximum. Then, as shown in the drawing, in a case where the amount of received light of the solar cell is decreasing (R=100%→R=25%), the generated voltage-current characteristic changes in a direction in which a current ($I_{100}{\to}I_{25}$) is reduced with respect to the generated voltage. Accordingly, generated power ($P_{100}{\to}P_{25}$) also decreases, and as indicated by a dotted line shown in the drawing, the maximum output point x also changes. In a case where a plurality of solar cells having such a characteristic is simply connected in series in a circuit, a common current flows in all solar cells. For this reason, when all solar cells have the substantially same amount of received light, and have the substantially coincident maximum output point, the current becomes the same at the maximum output point, and all solar cells can be operated at the maximum output points. However, in a case where the amount of received light of a part of the solar cells in the solar cell module is reduced due to a shadow, a current common to a cell having a large amount of received light flows in a solar cell in which the amount of received light is reduced. Thus, an operation point of the solar cell is deviated from the maximum output point, and the amount of generated power of the solar cell is reduced to a greater extent than reduction in the amount of received light. Since the solar cell itself, in which the amount of received light is reduced, becomes a resistor to a current flowing therethrough, power loss occurs, and a further decrease of output of the solar cell module is caused. That is, as described above, in a case where variation of the amount of received light is present among the solar cells in the solar cell module, a maximum power generation output corresponding to the amount of received light of the solar cell module is not obtained due to the variation, and output loss occurs.

Accordingly, as a device that avoids a decrease in output due to the variation of the amount of received light among the solar cells in such a solar cell module, a power generation output voltage control circuit device that is able to control an operation point of each of the solar cells connected in series individually has been suggested (Toshihisa Shimizu and six others, Proceedings of Japan Solar Energy Association/Japan Wind Energy Association Joint Conference, 1996, pp. 57-60, Toshihisa Shimizu, FB Technical News No. 56, Nov. 1, 2000, pp. 22-27, and Toshihisa Shimizu and three others, "Generation Control Circuit for Photovoltaic Modules" IEEE TRANSACTIONS ON POWER ELECTRONICS, VOL. 16, NO. 3, May 2001, pp. 293-300). Such a power generation output voltage control circuit device controls generated voltage for each solar cell using a multi-stage boosting and deboosting chopper circuit in a circuit configuration, in which a plurality of solar cells is connected in series, thereby being able to make different currents flow in the solar cells. With this, even though the solar cells connected in series are different in the amount of received light, the generated voltage can be adjusted such that a current flows in each solar cell at the maximum output point. Accordingly, all solar cells can be made to generate power substantially at the maximum output points.

Japanese Unexamined Patent Application Publication No. 2018-038245 (JP 2018-038245 A) has suggested a configuration using the power generation output voltage control circuit device described above. In the configuration, as shown illustrated in FIG. 9B, in a column of n (where n is a positive integer) switching units connected in series corresponding to each solar cell, capacitors (referred to as "voltage stabilization capacitors") are connected in parallel to both ends of all sets of (2m−1)th (where m is all integers of 1 to n/2) and 2m-th switching units an all sets of (2i−2)th (where it is an integer of 2 to n/2) and (2i−1)th switching units counted from one end of the column of the switching units, respectively, and the states of the switching units connected in series are alternately switched between a first phase where all odd-numbered switching units counted from one end of the column of the switching units are brought into a cutoff state (OFF state) and all even-numbered switching units are brought into an electrical conduction state (ON state) and a second phase where all odd-numbered switching units are brought into the electrical conduction state (ON state) and all even-numbered switching units are brought into the cutoff state (OFF state). In such a configuration, in a state in which a flow of a current with a different level for each solar cell is permitted, a duty ratio (a ratio of a length of a period of the cutoff state to a length of a predetermined cycle, that is, a sum of a period of the electrical conduction state and the period of the cutoff state) of the switching unit is not adjusted for each solar cell, but is set evenly, for example, to 1/2, and the generated voltages of all solar cells can be adjusted evenly to the same value. In regard to this point, as understood from FIG. 9A, in a case where the amount of received light of the solar cell is reduced (R=100% to 25%), and the generated voltage-current characteristic changes in a direction in which the generated power ($P_{100}$ to $P_{25}$) and the current value ($I_{100}$ to $I_{25}$) are reduced with respect to the generated voltage, and accordingly, the generated voltage corresponding to the maximum power point (x) changes. For this reason, in a case where an actual generated voltage of each solar cell is adjusted evenly, for example, to the generated voltage (one-dot-chain line: $V_{mpp100}$) of the solar cell (R=100%) having the largest amount of received light at the maximum power point, in the solar cell (R=75%, 50%, or 25%) having a small amount of received light, the actual generated voltage is deviated from the generated voltage at the maximum power point, and the generated power ($P_{75}$, $P_{50}$, or $P_{25}$) is reduced compared to power of each solar cell at the maximum power point. However, as understood from the drawings, in general, a change width of a voltage value at the maximum power point x with change in the amount of received light is comparatively small in a generated power characteristic of each amount of received light, and change in generated power value with respect to change in voltage value near the maximum power point is also comparatively gentle. For this reason, it is understood that a reduction amount $\Delta P1$, $\Delta P2$, or $\Delta P3$ of the generated power that may occur due to the deviation of the operation point from the maximum power point caused by evenly adjusting the actual generated voltage of each solar cell is not so large. Thus, according to the configuration, while at least one of the decrease in output or output loss due to the variation of the amount of received light among the solar cells as described above is suppressed small, the duty ratio of the switching unit does not need to be adjusted for each solar cell, and may be set evenly to 1/2, whereby switching control of the switching units is simplified, and time and effort needed for setting the control can be significantly reduced.

SUMMARY

Incidentally, the above-described power generation output voltage control circuit device has a configuration in which one switching unit is provided for one solar cell. As such a switching unit, typically, a transistor, such as a metal oxide semiconductor field effect transistor (MOSFET) as an active switch is used, and accordingly, cost is needed. For each switching unit, there is need to individually provide a circuit that supplies a control input for switching the state between both terminals between the cutoff state and the electrical conduction state from a control device, and accordingly, the configuration of the circuit is likely to be complicated. In regard to this point, the circuit configuration of the power generation output voltage control circuit device of the related art as illustrated in FIG. 9B has been examined. In the configuration in which the above-described voltage stabilization capacitor is provided, a direction of a voltage between the solar cell and the voltage stabilization capacitor is made to be cyclically inverted with a configuration using a unit, such as an inductor or a transformer described below in detail. With this, even though a switching unit, such as a MOSFET, is replaced with a rectifier unit, such as a diode, similarly to the circuit described in JP 2018-038245 A, the generated voltages of all solar cells can be adjusted evenly in a state in which a flow of a current with a different level for each solar cell is permitted. In this way, in a case where the switching unit is replaced with the rectifying unit, it will be advantageous in that cost is reduced accordingly, and the circuit for the control input of the switching unit is not needed. In the disclosure, the knowledge is used.

The disclosure provides a power generation output voltage control circuit device capable of evenly adjusting generated voltages of all cells without depending on an amount of received light of each cell in a solar cell module including a column of a plurality of solar cells connected in series, and specifically, a device in which the switching unit in the circuit configuration of the related art is replaced with a rectifying unit. It is assumed that the "power generation output voltage control circuit device" indicates a device having circuit portions (a connection terminal to a solar cell, a diode, a capacitor, an inductor or a transformer, and the like) for controlling a generated voltage and a current of each of solar cells connected in series, and a "solar power generation device" indicates a device having a configuration including a solar cell module having solar cells connected in series and the power generation operation point control circuit.

Incidentally, the circuit configuration of a device according to the disclosure described below in more detail is not limited to a solar cell, and is also usable for control of an operation voltage of each power supply element in a module in which any power supply elements (for example, chemical cells, fuel cells, storage cells, power generators, thermoelectric elements, or the like) configured to output power are connected in series. Accordingly, the disclosure provides an output voltage control circuit device capable of controlling an operation point of an individual power supply element (cell) in a module, in which at least one of a plurality of solar cells or power supply elements (cells, storage cells, power generators, thermoelectric elements, or the like) is connected in series, and specifically, a device in which the switching unit in the circuit configuration of the related art is replaced with a rectifying unit.

An aspect of the disclosure relates to an output voltage control circuit device for a plurality of power supply cells connected in series. The device includes a pair of output terminals, a plurality of electrode connection terminals, capacitors, rectifying units, voltage generation units, a voltage control circuit unit, and voltage holding capacitors. The electrode connection terminals are connected to positive electrodes and negative electrodes of respective 2k+1 (where k is a positive integer) power supply cells having the positive electrodes and the negative electrodes connected in series between the output terminals. The capacitors are connected in parallel to the respective power supply cells through the corresponding electrode connection terminals between the output terminals. The rectifying units are connected in parallel to the respective power supply cells through the corresponding electrode connection terminals between the output terminals. Each of the rectifying units has an anode connected to the electrode connection terminal on a negative electrode side of the power supply cell between the connected electrode connection terminals and a cathode connected to the electrode connection terminal on a positive electrode side of the power supply cell between the connected electrode connection terminals. Each of the rectifying units is configured to permit a flow of a current solely in a direction from the anode to the cathode in the rectifying unit. The voltage generation units are connected between the electrode connection terminals connected to a negative electrode side of odd-numbered power supply cells counted from the negative electrode side among the power supply cells and the positive electrodes of the rectifying units corresponding to the odd-numbered power supply cells. Each of the voltage generation units is configured such that a current is able to flow in both directions between both ends of the voltage generation unit, and to generate a voltage, which is cyclically inverted, between both ends. The voltage control circuit unit has a circuit line connected in parallel to a first voltage generation unit of the voltage generation units connected between the negative electrode of a first power supply cell counted from the negative electrode side among the power supply cells and the anode of the rectifying unit corresponding to the power supply cell. The voltage control circuit unit is configured to generate a voltage between both ends of the first voltage generation unit. The voltage holding capacitors are connected in parallel between the circuit line and the cathode of the rectifying unit corresponding to the first power supply cell counted from the negative electrode side of the power supply cells among the rectifying units, between the anode of the rectifying unit corresponding to a 2j-th (where j is an integer of 1 to k) power supply cell counted from the negative electrode side of the power supply cells among the rectifying units and the cathode of the rectifying unit corresponding to a (2j+1)th power supply cell counted from the negative electrode side, and between the anode of the rectifying unit corresponding to a (2j−1)th power supply cell counted from the negative electrode side of the power supply cells among the rectifying units and the cathode of the rectifying unit corresponding to the 2j-th power supply cell. The voltage control circuit unit generates a voltage, which has a magnitude discretionarily set and a direction of which is cyclically inverted, between both ends of the first voltage generation unit.

In the above-described configuration, the "power supply cell" may be a solar cell or any power supply element that discharges a current from a positive electrode, and outputs power as a current flows into a negative electrode, such as a chemical cell, a fuel cell, a storage cell, a power generator, a thermoelectric element, or the like. The "rectifying unit" may be any unit or element as long as the unit that permits a flow of a current solely in a direction from a anode to a cathode in the rectifying unit, and typically, may be a diode. The "voltage generation unit" is configured of a conductor in which a current is able to flow between both ends thereof, and may be an element or a unit in which electromotive force is generated between both ends by any principle. For the "voltage generation unit", as described below, typically, a coil of an inductor or a transformer is employed; however, the disclosure is not limited thereto. The "voltage control circuit unit" may be, for example, as illustrated below, a circuit unit that generates a voltage between both ends of the first voltage generation unit connected between the negative electrode of the first power supply cell counted from the negative electrode side of the power supply cells and the anode of the rectifying unit corresponding to the power supply cell in any aspect. The "capacitor" connected in parallel to the power supply cell and the "voltage holding capacitor" may be normal capacitors (the term "voltage holding capacitor" is used for the purpose of distinguishing from the "capacitor" connected in parallel to the power supply cell). The "magnitude discretionarily set" generated between both ends of the first voltage generation unit means a magnitude that may be appropriately set within a allowable range of an operation of an element or a unit in the device by a user or a designer of the device. The voltage generated between both ends of the first voltage generation unit may be typically a voltage, the direction of which is cyclically inverted at regular intervals and which has the same magnitude in both directions; however, the disclosure is not limited thereto (that is, the voltage may be different in magnitude and time depending on the direction).

The circuit configuration of the above-described device is basically similar to the configuration of the multi-stage boosting and deboosting chopper circuit in which the voltage stabilization capacitor (corresponding to the "voltage holding capacitor" in the configuration of the disclosure) described in JP 2018-038245 A cited in "Description of Related Art" is used, and is a configuration in which a switching unit connected in parallel to each of the solar cells or other power supply cells connected in series in the configuration of the related art is replaced with the rectifying unit, such as a diode, which does not need a control input. In such a configuration, in a case where the voltage control circuit unit generates the voltage, who has the magnitude optically set and the direction of which is cyclically inverted, between both ends of the first voltage generation unit, as described below in detail in "DETAILED DESCRIPTION OF EMBODIMENTS", in a state in which different currents are able to flow in the respective power supply cells with the operations of the voltage generation units, the rectifying units, the voltage holding capacitors, and the capacitors parallel to the respective power supply cells, the magnitude of an operation voltage (in a solar cell, a generated voltage) of each power supply cell coincides with the magnitude of the voltage generated in any direction between both ends of the first voltage generation unit. In particular, in a case where the voltage, the direction of which is cyclically inverted at regular intervals and which has the same magnitude in both directions, is generated between both ends of the first voltage generation unit, it is possible to evenly adjust the operation voltage of the power supply cell to the same magnitude.

Therefore, in a case where the above-described device is applied to a solar cell module in which solar cells are connected in series, it is possible to evenly adjust a generated voltage of each solar cell, and to set the currents flowing in the cells to different levels according to a voltage-current characteristic corresponding to the amount of received light of each cell. Furthermore, in a case where the generated voltage between both ends of the first voltage generation unit is set to the generated voltage of the cell having the largest amount of received light at the maximum power point, the generated voltages of all cells are adjusted to the voltage. Thus, it is possible to suppress at least one of a decrease in output or output loss due to the variation of the amount of received light among the solar cells described in "Description of Related Art" comparatively small. In this case, in the circuit configuration of the disclosure, as described above, since the switching unit connected in parallel to each power supply cell is replaced with the rectifying unit, the circuit configuration and control for individually providing a control input to each switching unit in the configuration of the related art is not needed, and since dynamic control may be performed solely on the voltage control circuit unit, the configuration of the device and the operation for control are simplified. Furthermore, since a transistor, such as a MOSFET, which is used as the switching unit is replaced with the rectifying unit, such as a diode, saving of cost is expected accordingly.

The configuration of the voltage control circuit unit in the above-described device may be specifically implemented by any of aspects described below.

In the above-described aspect, each of the voltage generation units may be an inductor. The voltage control circuit unit may include a voltage source, a capacitor, and a switching unit. The voltage source may have a negative electrode connected to the circuit line and a positive electrode connected to the electrode connection terminal connected to the negative electrode of the first power supply cell counted from the negative electrode side of the power supply cells. The voltage source may be configured to generate a voltage having a magnitude discretionarily set between the positive electrode and the negative electrode. The capacitor may be connected in parallel to the voltage source. The switching unit may be connected in parallel to the voltage source through the circuit line and the first voltage generation unit. The switching unit may be configured to selectively provide electrical conduction between both terminals. Control may be performed such that the switching unit repeatedly switches a state between both terminals between an electrical conduction state and a cutoff state cyclically.

Here, the "voltage source" may be any voltage source that is able to supply the voltage discretionarily set between the positive electrode and the negative electrode. In the configuration of this aspect, as understood from description referring to drawings described below, the voltage source is connected in series to a column of the power supply cells. The "switching unit" may be any unit, such as a MOSFET or other transistors used in the field, in which an electrical conduction state and a cutoff state of a current between a pair of terminals are switched in response to a control input. In the configuration of this aspect, as understood from description referring to drawings described below, the switching unit is connected in series to a column of the rectifying units correspondingly connected to the power supply cells.

In the above-described configuration, in a case where the switching unit operates to repeatedly switch the state between both terminals between the electrical conduction state and the cutoff state cyclically, a voltage, a direction of which is alternately inverted, is generated between both ends of the first voltage generation unit, and with this, as described above, the magnitude of the operation voltage of each power supply cell is decided. In particular, in a case where control is performed such that the switching unit repeatedly switches the state of both terminals between the electrical conduction state and the cutoff state cyclically at regular intervals (that is, in a case where a duty ratio is 1/2), a voltage, which has the same magnitude as the voltage of the voltage source and a direction of which is alternately inverted, is generated between both ends of the first voltage generation unit, and the operation voltage of each power supply cell is adjusted evenly to be the same as the voltage between both ends of the voltage source. In this aspect, since a target of dynamic control is one switching unit in the voltage control circuit unit, the configuration of the circuit is simplified (the number of circuits for a control input may be one) and control is also simplified compared to the related art.

In the above-described aspect, the power supply cells and the voltage source may be connected between the output terminals. In this case, a voltage that is 2k+2 times the voltage of the voltage source can be generated between the output terminals.

In the above-described aspect, solely the power supply cells may be connected between the output terminals. The voltage source may be connected outside between the output terminals. In this case, a voltage that is 2k+1 times the voltage of the voltage source can be generated between the output terminals.

In the configuration of the above-described aspect, in a case where switching of the state between both terminals of the switching unit to between the electrical conduction state and the cutoff state is not performed at regular intervals (that is, in a case where the duty ratio d is not 1/2), the operation voltages of the even-numbered power supply cells counted from the negative electrode side of the power supply cells coincide evenly with a supply voltage of the voltage source, and the operation voltages of the odd-numbered power supply cells counted from the negative electrode side of the power supply cells coincide evenly with a value obtained by multiplying the supply voltage of the voltage source by $d/(1-d)$. It should be understood that this case also belongs to the scope of the disclosure.

In the above-described aspect, each of the voltage generation units may be an inductor. The voltage control circuit unit may include a voltage source, additional electrode connection terminals, a capacitor, and a switching unit. The voltage source may have a negative electrode connected to the circuit line and a positive electrode connected to the anode of the rectifying unit corresponding to the first power supply cell counted from the negative electrode side among the power supply cells through the inductor. The voltage source may be configured to generate the voltage having the magnitude discretionarily set between the positive electrode and the negative electrode. The additional electrode connection terminals may have a negative electrode connected to the circuit line and a positive electrode connected to the electrode connection terminal connected to the negative electrode of the first power supply cell counted from the negative electrode side among the power supply cells. The additional electrode connection terminals may be connected to a positive electrode and a negative electrode of an additional power supply cell connected in series to the negative electrode side of the power supply cells. The capacitor may be connected in parallel to the additional power supply cell through the additional electrode connection terminals. The switching unit may be connected in parallel to the voltage source between the circuit line and the anode of the rectifying unit corresponding to the first power supply cell counted from the negative electrode side among the power supply cells. The switching unit may be configured to selectively provide electrical conduction between both terminals. Control may be performed such that the switching unit repeatedly switches a state between both terminals between an electrical conduction state and a cutoff state cyclically.

Here, the "switching unit" may be the same unit as in the above-described aspect, and as understood from description referring to drawings described below, the switching unit is connected in series to the column of the rectifying units correspondingly connected to the power supply cells. The "voltage source" may also be any voltage source that is the same as in the above-described aspect. In this case, as understood from description referring to drawings described below, the voltage source is connected in parallel to the switching unit through the inductor. Then, in this aspect, the additional power supply cell and the additional capacitor are connected in series to the column of the power supply cells and the column of the capacitor connected in parallel to the respective power supply cells on the negative electrode side of the power supply cells, respectively. In such a configuration, in a case where the switching unit operates to repeat the electrical conduction state and the cutoff state between both terminals cyclically, a voltage, a direction of which is alternately inverted, is generated between both ends of the first voltage generation unit. With this, as described above, the magnitude of the operation voltage of each power supply cell is decided. In particular, in a case where control is performed such that the switching unit repeatedly switches the state between both terminals between the electrical conduction state and the cutoff state cyclically at regular intervals (that is, in a case where the duty ratio is 1/2), a voltage having the same magnitude as the supply voltage of the voltage source is generated such that a direction of the voltage is alternately inverted between both ends of the first voltage generation unit, and the magnitude of the operation voltage of the additional power supply cell becomes the same to the magnitude of the generated voltage between both ends of the first voltage generation unit. Thus, as described above, it is possible to evenly adjust the operation voltage of each power supply cell to be the same as the voltage between both ends of the voltage source. In this aspect, since a target of dynamic control is one switching unit in the voltage control circuit unit, the configuration of the circuit is simplified (the number of circuits for a control input may be one) and control is also facilitated compared to the related art. In this aspect, the operation voltage (the magnitude is 2k+2 times the voltage of the voltage source) in a case where 2k+2 power supply cells are connected in series in conformity with the power supply cells and the additional power supply cell is obtained between the output terminals, and the circuit is expected to be more effectively used. In this aspect, in a case where switching of the state between both terminals of the switching unit to between the electrical conduction state and the cutoff state is not performed at regular intervals (that is, in a case where the duty ratio d is not 1/2), the operation voltages of the additional power supply cell and the even-numbered power supply cells counted from the negative electrode side of the power supply cells coincide evenly with the supply voltage of the voltage source, and the operation voltages of the odd-numbered power supply cells counted from the negative electrode side of the power supply cells coincide evenly with a value obtained by multiplying the supply voltage of the voltage source by d/(1−d). It should be understood that this case also belongs to the scope of the disclosure.

In the above-described aspect, each of the voltage generation units may be an inductor. The voltage control circuit unit may include additional electrode connection terminals, a capacitor, and a switching unit. The additional electrode connection terminals may have a negative electrode connected to the circuit line and a positive electrode connected to the electrode connection terminal connected to the negative electrode of the first power supply cell counted from the negative electrode side among the power supply cells. The additional electrode connection terminals may be connected to a positive electrode and a negative electrode of an additional power supply cell connected in series to the negative electrode side of the power supply cells, respectively. The capacitor may be connected in parallel to the additional power supply cell. The switching unit may be connected in parallel to the additional power supply cell through the circuit line and the first voltage generation unit. The switching unit may be configured to selectively provide electrical conduction between both terminals. The power supply cells and the additional power supply cell may be connected between the output terminals. A device configured to control an output voltage may be connected between the output terminals. Control may be performed such that the switching unit repeatedly switches a state between both terminals between an electrical conduction state and a cutoff state cyclically.

In the above-described aspect, the power supply cells and the additional power supply cell may be connected between the output terminals.

Here, the "switching unit" may be the same unit as in the above-described aspect. As understood from description referring to drawings described below, the switching unit is connected in series to the column of the rectifying units correspondingly connected to the power supply cells. As in the above-described aspect, the additional power supply cell and the additional capacitor are connected in series to the column of the power supply cells and the column of the capacitor connected in parallel to the respective power supply cells on the negative electrode side of the power supply cells, respectively. Then, in this aspect, the device configured to control the output voltage is connected between the output terminals, and the voltage between the output terminals is held to the magnitude discretionarily set. In such a configuration, in a case where the switching unit operates to repeat the electrical conduction state and the cutoff state between the negative electrode and the positive electrode of the voltage source cyclically at regular time intervals (that is, in a case where the duty ratio is 1/2), the voltage having the same magnitude as the operation voltage of the additional power supply cell is generated between both ends of the first voltage generation unit such that the direction is alternately inverted. With this, as described above, the magnitude and the direction of the operation voltage of each power supply cell are adjusted evenly to be the same. In this case, the voltage (output voltage) between the output terminals, that is, the operation voltages of the power supply cells or the power supply cells and the additional power supply cell are held to the magnitude discretionarily set. Thus, the operation voltage of each power supply cell can be adjusted by a magnitude obtained by dividing the magnitude of the output voltage by 2k+1 (or 2k+2). In this aspect, since a target of dynamic control is one switching unit in the voltage control circuit unit, the configuration of the circuit is simplified and control is also simplified compared to the related art. In this aspect, since a voltage source connected in parallel to the switching unit is not needed, the configuration of the circuit is simplified, and the operation voltage in a case where 2k+2 power supply cells are connected in series in conformity with the power supply cells and the additional power supply cell is obtained between the output terminals, the circuit is expected to be more effectively used. In this aspect, in a case where switching of the state between both terminals of the switching unit to between the electrical conduction state and the cutoff state is not performed at regular intervals (that is, in a case where the duty ratio d is not 1/2), and the operation voltages of the additional power supply cell and the even-numbered power supply cells counted from the negative electrode side of the power supply cells are adjusted evenly to a first voltage, the operation voltages of the odd-numbered power supply cells counted from the negative electrode side of the power supply cells are adjusted evenly to a value obtained by multiplying the first voltage by d/(1−d), and the total of the operation voltages coincides with the output voltage between the output terminals. It should be understood that this case also belongs to the scope of the disclosure.

In the above-described aspect, the device may further include additional voltage generation units connected between the electrode connection terminals connected to the negative electrode side of the even-numbered power supply cells counted from the negative electrode side of the power supply cells and the anode of the rectifying units corresponding to the even-numbered power supply cells. Each of the additional voltage generation units may be configured such that a current is able to flow in both directions between both ends and a generated voltage between both ends is able to be cyclically inverted. It should be understood that this case also belongs to the scope of the disclosure. Here, the above-described voltage generation unit may be an inductor.

In the above-described aspect, the switching unit may be controlled such that a state between both terminals of the switching unit is repeatedly switched between an electrical conduction state and a cutoff state cyclically at regular intervals.

In the above-described aspect, the voltage control circuit unit may include a transformer having a primary coil and a secondary coil. The first voltage generation unit is the secondary coil of the transformer. The transformer may be a transformer that generates a voltage, which has a magnitude discretionarily set and a direction of which is cyclically inverted, between both ends of the secondary coil. Here, as described above, the "transformer" may be any transformer that has a magnetic circuit wound with a primary coil and a secondary coil, and is able to generate a voltage having an appropriate magnitude between both ends of the secondary coil as the operation voltage of the power supply cell. Specifically, the configuration of the primary coil side of the transformer may be a configuration of a closed circuit (any load resistor may be inserted into the circuit) having the direct-current voltage source capable of generating a voltage having any magnitude, the switching unit, and the primary coil, and may be configured such that the switching unit operates to repeat the electrical conduction state and the cutoff state between the negative electrode and the positive electrode of the voltage source cyclically. In such a configuration, in a case where the transformer generates a voltage, which has a magnitude discretionarily set between both ends of the secondary coil and a direction of which is cyclically inverted, in particular, at regular time intervals, as in the above-described case, the magnitude of the operation voltage of each power supply cell is adjusted evenly to be the same as the voltage between both ends of the secondary coil. According to such a configuration, since the voltage source (the voltage source on the primary coil side of the transformer) that decides the operation voltage of the power supply cell is electrically insulated from the power supply cells, a situation in which the circuit device can be applied is expected to be expanded.

In the above-described aspect, the voltage control circuit unit may further include additional electrode connection terminals, a capacitor, and an additional rectifying unit. The additional electrode connection terminals may have a negative electrode connected to the circuit line and a positive electrode connected to the electrode connection terminal connected to the negative electrode of the first power supply cell counted from the negative electrode side among the power supply cells, the additional electrode connection terminals being connected to a positive electrode and a negative electrode of an additional power supply cell connected in series to the negative electrode side of the power supply cells, respectively. The capacitor may be connected in parallel to the additional power supply cell through the electrode connection terminals. The additional rectifying unit may be connected in series to the rectifying unit between the circuit line and the anode of the rectifying unit corresponding to the first power supply cell counted from the negative electrode side among the power supply cells. That is, in such a configuration, a circuit in which the additional power supply cell, the additional capacitor, and the additional rectifying unit are connected in series on the negative electrode side of the power supply cells, and the 2k+2 power supply cells are connected in series is constituted. According to the configuration, in the circuit in which the power supply cells are connected in series, a switching unit that needs a control input is not present, and the entire circuit is constituted of passive electrical elements. Thus, the configuration of the circuit is simplified. Furthermore, since the operation voltage in a case where the 2k+2 power supply cells are connected in series in conformity with the power supply cells and the additional power supply cell is obtained between the output terminals, the circuit is expected to be more effectively used.

In the above-described aspect, another voltage generation unit other than the first voltage generation unit may be the secondary coil of the transformer. A generated voltage of the other voltage generation unit may be cyclically inverted in synchronization with the first voltage generation unit. In this case, since the voltage is adjusted in each voltage generation unit, a circuit operation is expected to be further stabilized.

In the above-described aspect, another voltage generation unit other than the first voltage generation unit may be an inductor. A generated voltage of the other voltage generation unit may be cyclically inverted in synchronization with the first voltage generation unit. In this case, since the transformer is provided at one place, the power consumption of the circuit is relatively reduced.

In the above-described aspect, each of the power supply cells may be at least one of a solar cell, a chemical cell, a fuel cell, a storage cell, a power generator, a thermoelectric element, or a combination of the cells.

In the above-described aspect, the voltage control circuit unit may be configured to generate a voltage, a direction of which is cyclically inverted at regular intervals and which has the same magnitude, between both ends of the first voltage generation unit.

In the above-described aspect, each of the power supply cells may be a solar cell. The generated voltage between both ends of the first voltage generation unit may be set to a generated voltage at a maximum power point of the power supply cell having a largest amount of received light among the power supply cells.

In the above-described aspect, each of the power supply cells may be a solar cell. The generated voltage of the power supply cell having a largest amount of received light among the power supply cells may be set to a generated voltage at a maximum power point of the power supply cell.

In the configuration of the above-described aspect, the device may further include an additional voltage generation unit connected between the electrode connection terminal connected to the negative electrode side of an even-numbered power supply cell counted from the negative electrode side of the power supply cells connected in series and the anode of the rectifying unit corresponding to the even-numbered power supply cell. The additional voltage generation unit may be configured such that a current is able to flow in both directions between both ends and a generated voltage between both ends is able to be cyclically inverted. In this case, in a case where the additional voltage generation unit is the secondary coil of the transformer, control may be performed such that a generated voltage is cyclically inverted in a direction opposite to the generated voltage of the first voltage generation unit. It should be understood that this case also belongs to the scope of the disclosure.

In the configuration of the above-described aspect, in a case where the direction of the generated voltage between both ends of the secondary coil is not inverted at regular intervals, the operation voltages of the additional power supply cell and the even-numbered power supply cells counted from the negative electrode side of the power supply cells are adjusted evenly to a voltage in a case where the voltage is generated in the secondary coil from the rectifying unit side toward the power supply cell side, and the operation voltages of the odd-numbered power supply cells counted from the negative electrode side of the power supply cells are adjusted evenly to a voltage in a case where the voltage is generated in the secondary coil from the power supply cell side toward the rectifying unit side. It should be understood that this case also belongs to the scope of the disclosure.

Thus, in the configuration of the disclosure described above, since all switching units (or all switching units excluding one switching unit on the negative electrode side of the column of the power supply cells), such as MOSFETs, in the output voltage control circuit device of the related art are replaced with the rectifying units, such as diodes, cost is reduced accordingly. Furthermore, since a target of dynamic control is the voltage control circuit unit (or the switching unit in the voltage control circuit), there is no need to provide a circuit for a control input of the switching unit for each power supply cell, the configuration of the circuit is significantly simplified, and an operation in control is facilitated. According to the functional effects with such a new configuration of the disclosure, a scope where the output voltage control circuit device can be advantageously used is expected to be expanded.

Other objects and advantages of the disclosure will be apparent from the description of the following embodiments of the disclosure.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1A:
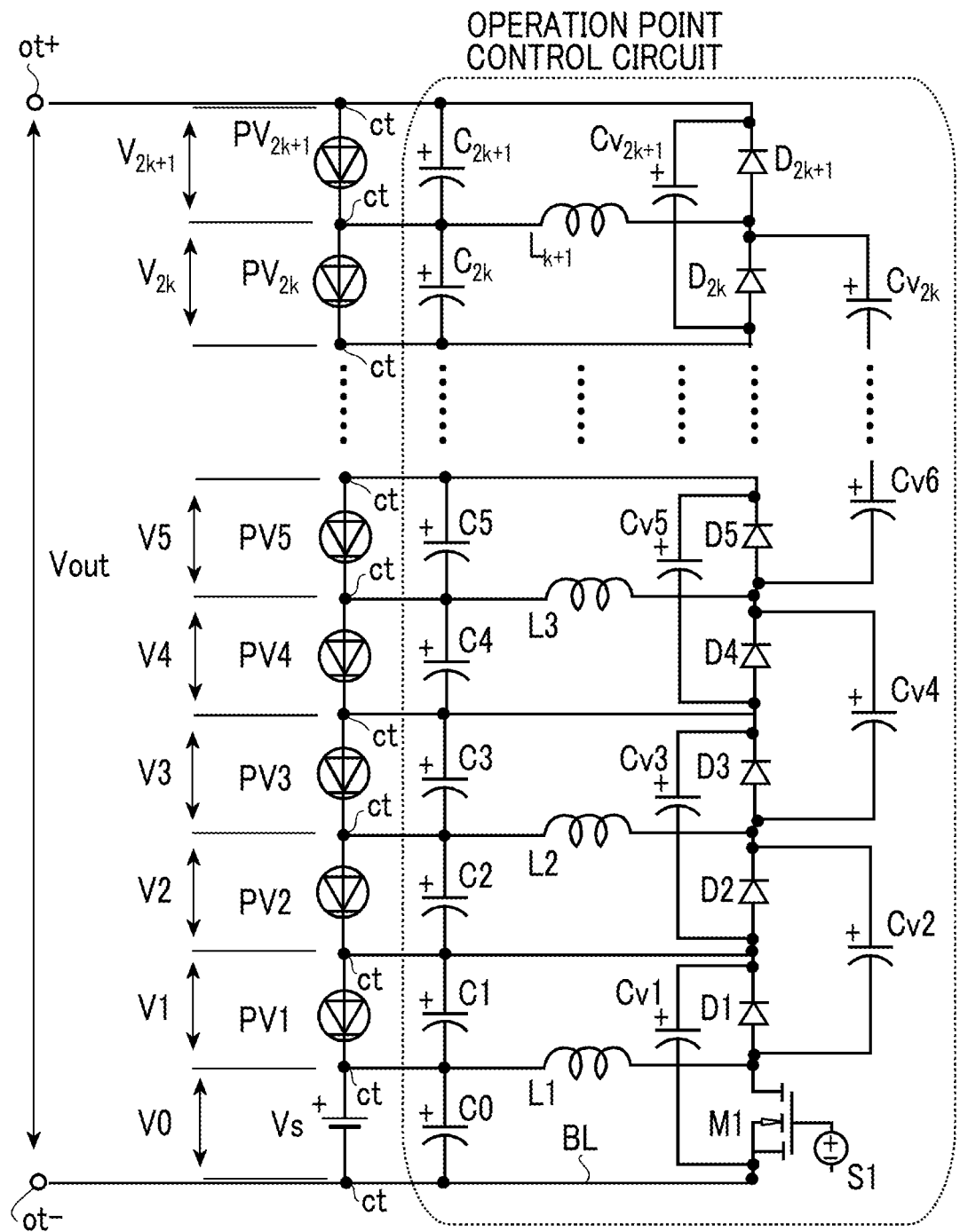
FIG. 1A is a circuit configuration diagram showing a first aspect of a solar power generation device that is constituted of a power generation output voltage control circuit device according to an embodiment and 2k+1 solar cells.

Hereinafter, the disclosure will be described in conjunction with several embodiments referring to the accompanying drawings. In the drawings, the same reference numerals indicate the same parts.

Figure 9A:
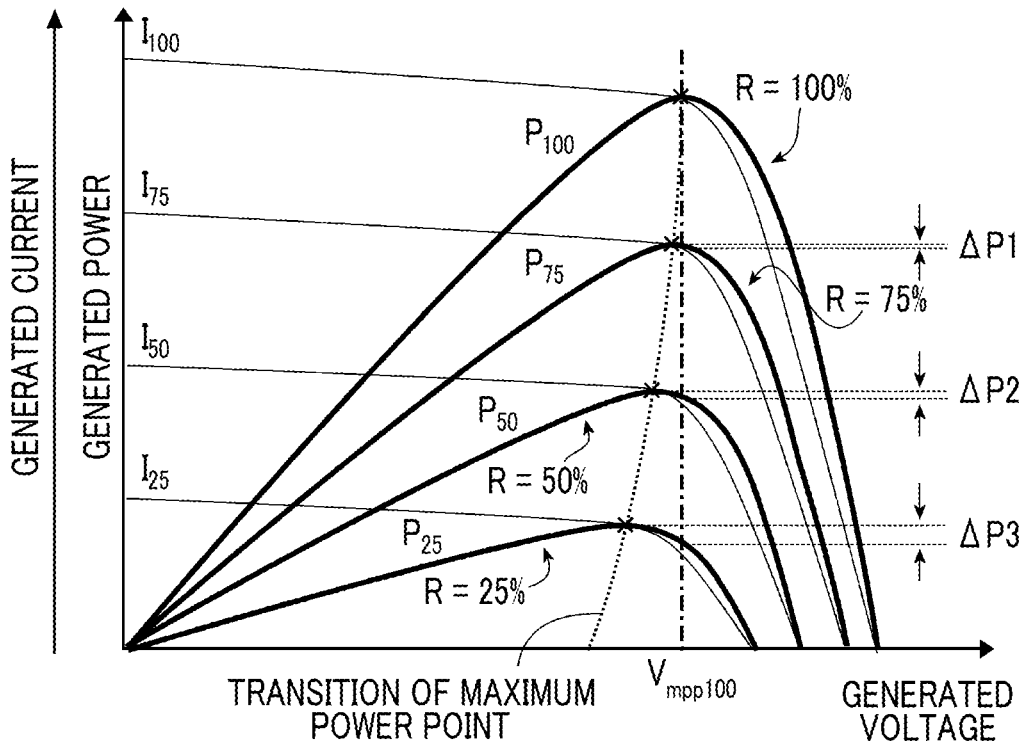
FIG. 9A is a characteristic diagram schematically showing changes of a generated current $I_R$ and generated power $P_R$ with respect to a generated voltage of a solar cell with various amounts of received light R (R indicates a proportion of each amount of received light in a case where the amount of received light of R=100% is 100%)
Figure 9B:
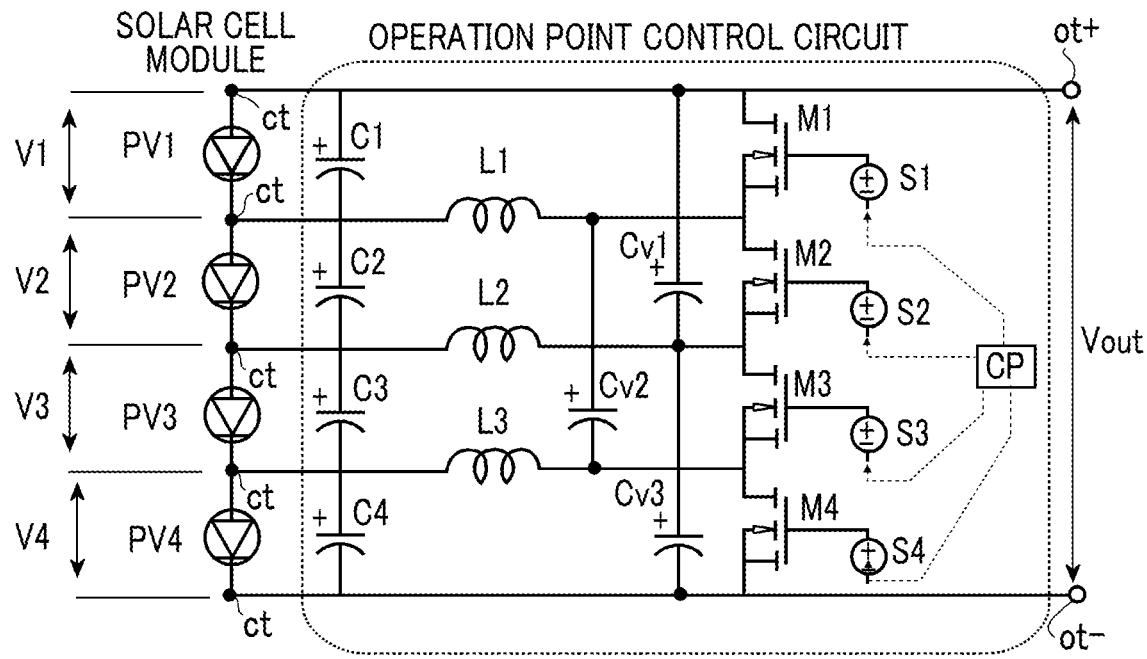
FIG. 9B shows an example of a circuit configuration diagram of a solar power generation device that has been suggested in the related art (JP 2018-038245 A or the like).

Configuration and Operation of Power Generation Output Voltage Control Circuit Device for Solar Cell Module A power generation output voltage control circuit device according to the embodiment that controls a power generation operation point of each cell in a solar cell module, in which a plurality of solar cells is connected in series, basically has the same configuration as a circuit in which voltage stabilization capacitors Cv1, . . . (in the embodiment, corresponding to voltage holding capacitors) are connected to every two switching units in order in a column M1, . . . of switching units connected in series in the multi-stage boosting and deboosting chopper circuit described in JP 2018-038245 A as illustrated in FIG. 9B. In this case, a unit (voltage control circuit unit) that cyclically inverts a direction of a generated voltage of an inductor (voltage generation unit) connected thereto is configured on the negative electrode side of the column of the solar cells. Accordingly, a plurality of switching units connected in series can be replaced with rectifying units (elements, such as diodes, which permit a flow of a current solely in a direction from an anode toward a cathode). With this, reduction in cost and simplification of the configuration of the circuit and control are achieved. Specifically, the power generation output voltage control circuit device of the embodiment is configured in various aspects described below.

1. Configuration of First Aspect

Referring to FIG. 1A, in the configuration of a first aspect of the embodiment, the circuit of the power generation output voltage control circuit device has, specifically, a pair of output terminals ot+, ot−, and electrode connection terminals ct that are respectively connected to a positive electrode and a negative electrode of each solar cell PVn (where n is an integer of 1 to 2k+1, and k is a positive integer) in order to connect a plurality of solar cells in series between the output terminals ot+, ot−. In the first aspect, the number of cells connected in series basically becomes an odd number equal to or greater than 3. To the electrode connection terminals ct, capacitors Cn (C1, C2, . . . , $C_{2k+1}$) are connected in parallel to the solar cells PVn, and diodes Dn (D1, D2, . . . , $D_{2k+1}$) as rectifying units are connected such that an anode and a cathode of each diode are connected to a negative electrode and a positive electrode of the corresponding solar cell. Inductors Lm (L1, L2, . . . , $L_{k+1}$) as voltage generation units are inserted between the electrode connection terminals ct on the negative electrode side of the odd-numbered solar cells PVn counted from a negative electrode side (in the drawing, a lower side) of a column of the solar cells PVn and the anodes of the diodes Dn, respectively. As a voltage control circuit unit that generates a voltage, which has a magnitude discretionarily set and a direction of which is cyclically inverted, between both ends of the inductor L1 connected to the negative electrode side of the column of the solar cells PVn, a voltage source Vs is connected in series to the negative electrode of the cell PV1 on the negative electrode side of the column of the solar cells PVn (that is, a positive electrode of the voltage source Vs is connected to the negative electrode of the cell PV1on the negative electrode side). A switching unit, which may be an MOSFET, or an element M1 is connected to the anode of the diode D1 corresponding to the cell PV1 on the negative electrode side of the column of the solar cells PVn. A negative electrode of the voltage source Vs is connected to a switching unit M1 through a circuit line BL such that the voltage source Vs, the inductor L1, and the switching unit M1 form a closed loop. A capacitor C0 may also be connected in parallel to the voltage source Vs. Then, as shown in the drawing, the voltage holding capacitors Cvn are connected in parallel to the switching unit M1 and the diode D1 connected in series to the switching unit M1, and both ends of all sets of (2j−1)th and 2j-th diodes (a set of first and second diodes, a set of third and fourth diodes, . . . ) and all sets of 2j-th and (2j+1)th diodes (a set of the second and third diodes, a set of the fourth and fifth diodes, . . . ) (where j is an integer of 1 to k) counted from the negative electrode side of the column of the solar cells PVn, respectively. The capacitors Cn, the diodes Dn, the voltage holding capacitors Cvn, the inductors Lm, and the switching unit M1 may be circuit elements that are normally used in the field. The voltage source Vs is any power supply device that is able to supply a voltage having a magnitude discretionarily set within a range of a generated voltage of the solar cell between the positive electrode and the negative electrode. Thus, as understood from the drawing, in the first aspect, the power generation output voltage control circuit device has a configuration in which the voltage source Vs is further connected in series to a module, in which 2k+1 solar cells PVn are connected in series. That is, the power generation output voltage control circuit device has a configuration in which the voltage holding capacitors Cvn are further connected in parallel to every two elements in order in a column of one switching unit and the 2k+1 diodes in a configuration of a (2k+2)-stage chopper circuit in which a chopper circuit, in which the switching units, excluding the switching unit corresponding to the voltage source Vs, are replaced with the diodes, is connected to 2k+2 power supply cells connected in series.

2. Operation of First Aspect

Figure 1B:
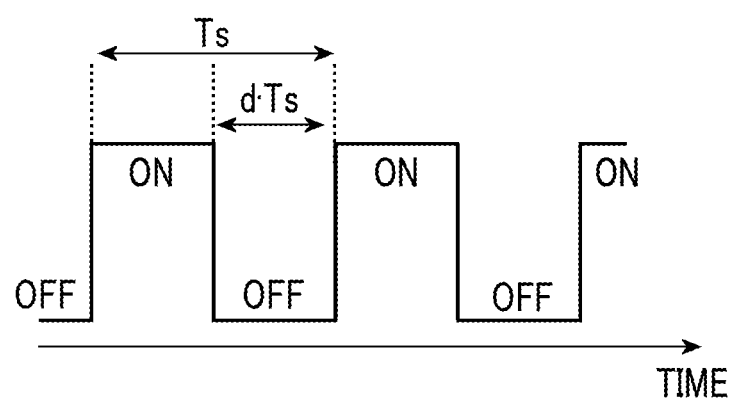
FIG. 1B shows a temporal change of a control signal provided to a control input S1 of a switching unit for switching control of an electrical conduction state (ON) and a cutoff state (OFF) between both terminals of the switching unit in the power generation output voltage control circuit device of FIG. 1A.

In the device of the first aspect of the embodiment shown in FIG. 1A, as schematically shown in FIG. 1B, the switching unit M1 that is connected in series to the column of the diodes Dn as an element of the voltage control circuit unit receives, from a control input S1, a control signal in which an ON state and an OFF state are cyclically changed at any duty ratio d (a ratio of a length of a period of a cutoff state to a length Ts of a cycle, which may be discretionarily set, that is, the sum of a period of an electrical conduction state and the period of the cutoff state) in a predetermined cycle time Ts, which may be discretionarily set. With this, the switching unit M1 is operated such that the electrical conduction state is brought between both terminals of the switching unit M1 when the control signal is ON, and the cutoff state is brought between both terminals of the switching unit M1 when the control signal is OFF. Therefore, electromotive force (induced voltage), the direction of which is inverted in synchronization with switching to the electrical conduction state and the cutoff state of the switching unit M1, is generated in the inductor L1 connected to the switching unit M1, and as a result of the operations of the inductors Lm, the diodes Dn, the voltage holding capacitors Cvn, and the capacitors Cn in the circuit during a subsequent switching operation of the ON state and the OFF state of the switching unit M1, the magnitude Vn of each of the generated voltages of all solar cells PVn is decided based on an output voltage V0 of the voltage source Vs.

In the configuration of the circuit of the above-described first aspect, a process in which the generated voltage Vn of each solar cell PVn is decided based on the output voltage V0 of the voltage source Vs during the switching operation of the ON state and the OFF state of the switching unit M1 will be described as follows.

Figure 2A:
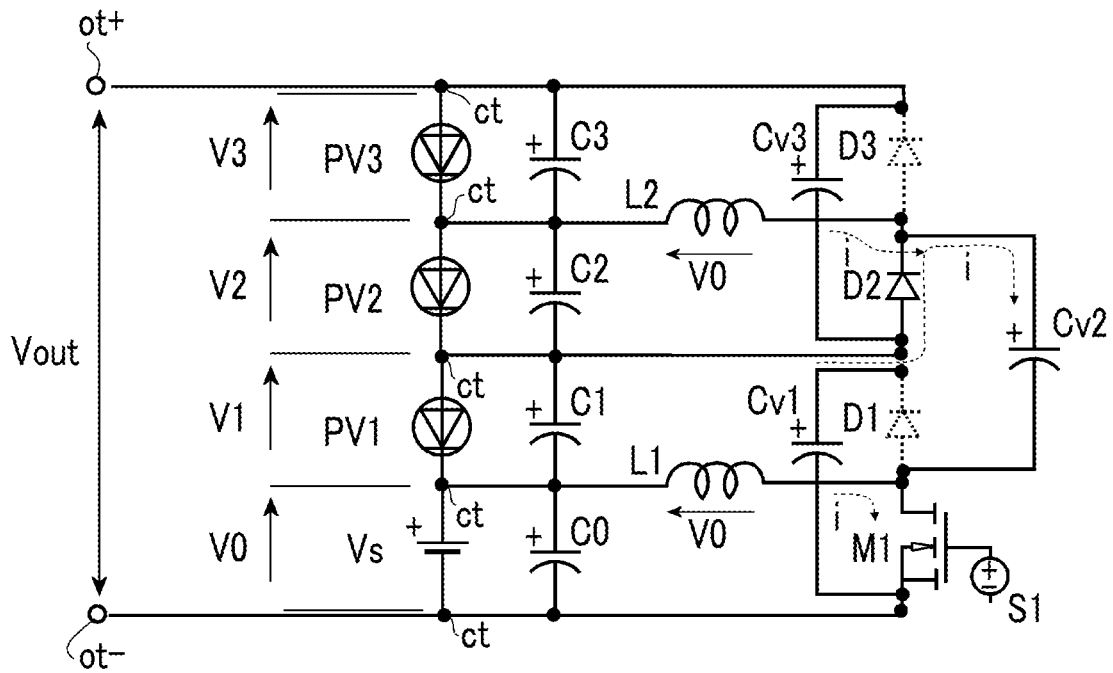
FIG. 2A is a circuit configuration diagram representing directions of a voltage and a current that are generated in each circuit element when the switching unit is in the ON state and the OFF state in the first aspect of the solar power generation device of FIG. 1A (for the purpose of description, it is assumed that the number of solar cells connected in series is three (in a case where k=1))
Figure 2B:
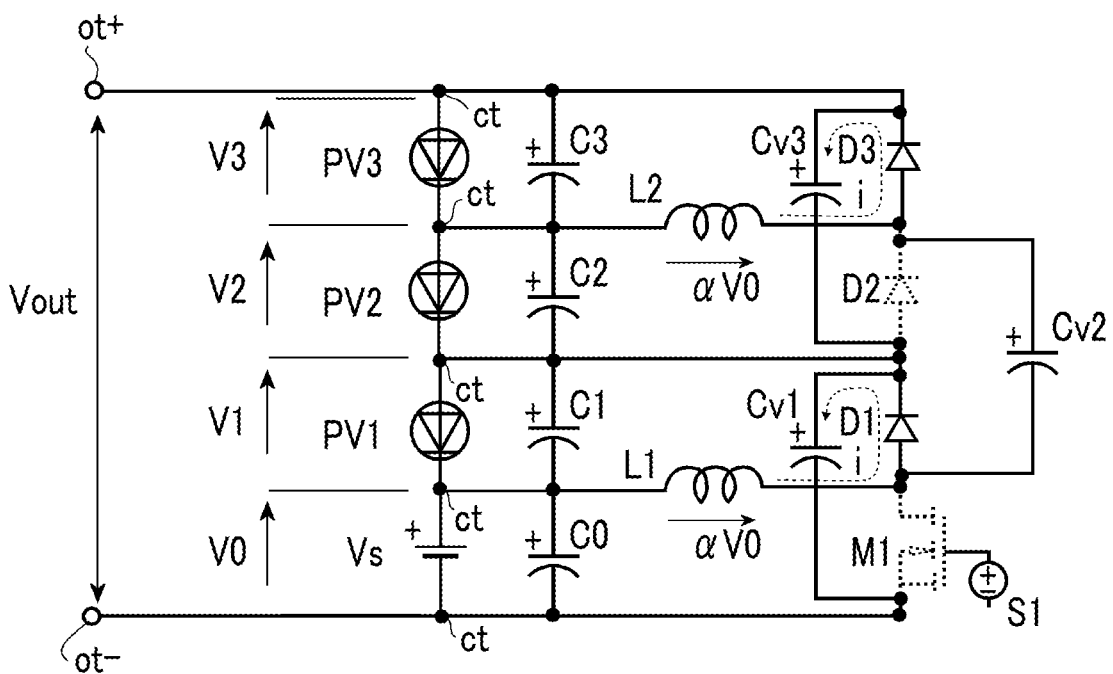
FIG. 2B is a circuit configuration diagram representing directions of a voltage and a current that are generated in each circuit element when the switching unit is in the ON state and the OFF state in the aspect of the solar power generation device of FIG. 1A (for the purpose of description, it is assumed that the number of solar cells connected in series is three (in a case where k=1))

Referring to FIGS. 2A and 2B, first, as in FIG. 2A, in a case where the switching unit M1 is brought into the ON state, and electrical conduction is provided between both terminals of the switching unit M1, a closed loop from the positive electrode of the voltage source Vs to the negative electrode of the voltage source Vs through the inductor L1 and the switching unit M1 can be formed. In this case, the Kirchhoff's law is established. For this reason, as indicated by an arrow in the FIG. 2A, the induced electromotive force (generated voltage) having the same magnitude as the output voltage V0 of the voltage source Vs is generated in the inductor L1 in a direction from the switching unit M1 toward the voltage source Vs. In this case, a potential on a contact of the switching unit M1 and the anode of the diode D1 is substantially the same as a potential on the negative electrode of the voltage source Vs, and the generated voltage of the inductor L1 is applied to the cathode of the diode D1 through the solar cell PVL. For this reason, a potential on the anode of the diode D1 does not become higher than a potential on the cathode of the diode D1, and a current does not flow in the diode D1 (the diode D1 is brought into an OFF state).

Next, as in FIG. 2B, in a case where the switching unit M1 is brought into the OFF state, a potential on a contact of the switching unit M1 and the diode D1, that is, the potential on the anode of the diode D becomes higher than the potential on the cathode of the diode D1, and a current that is flowing in the inductor L1 until then flows into the diode D1. Therefore, a closed loop from the positive electrode of the voltage source Vs to the negative electrode of the voltage source Vs through the voltage holding capacitor Cv1 by way of the inductor L1 and the diode D1 can be formed. In this case, electric charges are accumulated in the voltage holding capacitor Cv1, and a current passing through the inductor L1 decreases. For this reason, as indicated by an arrow in FIG. 2B, the direction of the voltage of the inductor L1 is inverted to a direction from the positive electrode of the voltage source Vs toward the anode of the diode D1. Under a condition that electromagnetic energy stored in the inductor L1 in the ON state of the switching unit M1 is discharged in the OFF state of the switching unit M1, a voltage Vb before inversion and a voltage Va after inversion of the inductor L1 have a relationship of Vb:Va=(1−d):d, and the magnitude of the voltage after inversion of the inductor L1 becomes a value $\alpha V0$ obtained by multiplying the output voltage V0 of the voltage source Vs by a function of a duty ratio $\alpha$ (=d/(1−d)). With this, a voltage $(1+\alpha)V0$ (=the output voltage V0 of the voltage source Vs+the generated voltage $\alpha V0$ of the inductor L1) is held in the voltage holding capacitor Cv1. In regard to the diode D2, an anode of the diode D2 is connected to the cathode of the diode D1, a cathode of the diode D2 is connected to the anode of the diode D1 through the voltage holding capacitor Cv2. In this case, when the diode D1 is in an electrical conduction state, a potential on the anode of the diode D2 does not become higher than the potential on the cathode of the diode D2. For this reason, a current does not flow in the diode D2 (the diode D2 is brought into the OFF state). In this case, since the diode D1 is in the electrical conduction state, a generated voltage of the solar cell PV1, that is, a generated voltage V1 becomes the same as the generated voltage $\alpha V0$ of the inductor L1 according to the Kirchhoff's law. Accordingly, a relationship of $V1=\alpha V0$ . . . (1) is established.

Then, as in FIG. 2A, in a case where the switching unit M1 is brought into the ON state again, and condition is made between both terminals, the voltage holding capacitor Cv1 holds the voltage $(1+\alpha)V0$. For this reason, as described above, the diode D1 is brought into the OFF state, and a potential on a terminal of the voltage holding capacitor Cv2 near the voltage source Vs coincides with a potential on a negative terminal of the voltage holding capacitor Cv1. In addition, since the voltage $(1+\alpha)V0$ is held in the voltage holding capacitor Cv1, the potential on the anode of the diode D2 becomes higher than the potential on the cathode of the diode D2, and a current flows in the diode D2 (the diode D2 is brought into the ON state). With this, a voltage of the voltage holding capacitor Cv2 becomes the same as the held voltage $(1+\alpha)V0$ of the voltage holding capacitor Cv1. In this case, a current that flows from the solar cell PV2 to the voltage holding capacitor Cv2 by way of the inductor L2 increases. For this reason, induced electromotive force is generated in the inductor L2 in a direction toward the solar cell PV2. In this case, since the diode D2 is in the electrical conduction state, the magnitude of a generated voltage of the solar cell PV2, that is, a generated voltage V2 becomes the same as the magnitude of a generated voltage of the inductor L2 according to Kirchhoff's law. In this case, a anode of the diode D3 is connected to a negative terminal of the inductor L2 and substantially has the same potential as a potential on a contact of the diode D1 and the diode D2, and a cathode of the diode D3 is connected to a positive terminal of the inductor L2 through the solar cell PV3. For this reason, the potential on the anode of the diode D3 does not become higher than the potential on the cathode of the diode D3, and a current does not flow in the diode D3 (the diode D3 is brought into the OFF state).

Thus, as in FIG. 2B, in a case where the switching unit M1 is brought into the OFF state again, as described above, the diode D1 is brought into the ON state again, the cathode of the diode D2 is connected to a positive terminal of the voltage holding capacitor Cv2 that holds the voltage $(1+\alpha)V0$, and the anode of the diode D2 is connected to a negative terminal of the voltage holding capacitor Cv2. Thus, the diode D2 is brought into the cutoff state. In regard to the diode D3, the anode of the diode D3 is connected to the positive terminal of the voltage holding capacitor Cv2, and the cathode of the diode D3 is connected to a positive terminal of the voltage holding capacitor Cv3. A negative terminal of the voltage holding capacitor Cv3 is connected to the negative terminal of the voltage holding capacitor Cv2. Thus, the diode D3 is brought into the electrical conduction state. With this, a current that is flowing in the inductor L2 until then flows into the diode D3, and a closed loop from a positive electrode of the solar cell PV2 to a negative electrode of the solar cell PV2 through the voltage holding capacitor Cv3 by way of the inductor L2 and the diode D3 can be formed. In this case, electric charges are accumulated in the voltage holding capacitor Cv3, and a current passing through the inductor L2 decreases. For this reason, as indicated by an arrow in FIG. 2B, the direction of the generated voltage of the inductor L2 is inverted to a direction from the positive electrode of the solar cell PV2 to the anode of the diode D3. As in the above-described case, the magnitude of the generated voltage of the inductor L2 in this case becomes the same as a times the voltage before inversion, and accordingly, becomes the same as a times the magnitude of the generated voltage V2 of the solar cell PV2. In this case, the sum of the generated voltage V2 of the solar cell PV2 and the generated voltage of the inductor L2 becomes the same as the held voltage $(1+\alpha)V0$ of the voltage holding capacitor Cv2 according to the Kirchhoff's law. As a result, a relationship of $V2=V0$ . . . (2) is established. Furthermore, since the diode D3 is in the electrical conduction state, a generated voltage of the solar cell PV3, that is, a generated voltage V3 becomes the same as the generated voltage of the inductor L2 according to the Kirchhoff's law. As a result, a relationship of $V3=\alpha V0$ . . . (3) is established. In addition, since the positive and negative terminals of the voltage holding capacitor Cv3 have the same potentials as the positive and negative terminals of the voltage holding capacitor Cv2, respectively, a held voltage of the voltage holding capacitor Cv3 also becomes $(1+\alpha)V0$.

In the above-described configuration, the capacitor Cn connected in parallel to the solar cell PVn and the voltage source Vs has a function of maintaining and stabilizing the voltages between both ends of the solar cell PVn and the voltage source Vs in an inversion process of the direction of the voltage of each of the series of inductors Lm. In the above-described configuration, a difference among the currents flowing in the respective solar cells PVn is absorbed by inflow and outflow of electric charges in the capacitors Cn and the voltage holding capacitors Cvn.

Even in a case where the number of solar cells connected in series is 2k+1, the generated voltage of the solar cell PVn is decided in the same manner as described above. Specifically, in the configuration of FIG. 1A, in a case where the switching unit M1 is repeatedly switched to the ON state and the OFF state, as described referring to FIGS. 2A and 2B, each voltage holding capacitor Cvn is repeatedly connected in parallel to the voltage holding capacitors $Cv_{n-1}$, $C_{n+1}$ before and after the voltage holding capacitor Cvn, and a held voltage of the voltage holding capacitor Cvn becomes $(1+\alpha)V0$ evenly in an equilibrium state. Then, a held voltage of the voltage holding capacitor $Cv_{2j+1}$ coincides with the sum $V_{2j}+V_{2j+1}$ of generated voltages of two adjacent solar cells $PV_{2j}$, $PV_{2j+1}$, a generated voltage $V_{2j}$ of the solar cell $PV_{2j}$ becomes the same as a voltage in a case where the direction of a generated voltage of the inductor $L_{j+1}$ is toward the solar cell side, and a generated voltage $V_{2j+1}$ of the solar cell $PV_{2j+1}$ becomes the same as a voltage ($\alpha$ times the generated voltage $V_{2j}$ of the solar cell $PV_{2j}$) in a case where the direction of the generated voltage of the inductor $L_{j+1}$ is toward the diode. As a result, the generated voltages of the even-numbered cells counted from the negative electrode side of the column of the solar cells coincide with the generated voltage V0 of the voltage source Vs evenly, and the generated voltages of the odd-numbered cells counted from the negative electrode side of the column of the solar cells coincide with $\alpha$V0 evenly. In addition, when the duty ratio d=1/2, that is, when the ON state and the OFF state of the switching unit M1 are switched at regular intervals, $\alpha$=1. Thus, the generated voltages of the solar cell PVn are adjusted evenly to the generated voltage V0 of the voltage source Vs.

Thus, in the circuit configuration of FIG. 1A, in a case where switching of the ON and OFF of the switching unit M1 is repeated with the duty ratio d=1/2, the generated voltages Vn of the 2k+1 solar cells Pvn connected in series coincide with the generated voltage V0 of the voltage source Vs. For this reason, in a case the generated voltage V0 of the voltage source Vs is made to coincide with, for example, a generated voltage Vmpp at the maximum power point of the cell having the largest amount of received light among a plurality of solar cells (see FIG. 9A), it is possible to execute the power generation operation of the solar cell module while suppressing at least one of a decrease in output or output loss due to the variation of the amount of received light among the solar cells. The control of the generated voltage V0 of the voltage source Vs may be achieved by, specifically, measuring the output power, the voltage, and the current of the solar cell module, and making the generated voltage V0 of the voltage source Vs coincide with a voltage, at which the output power, the voltage, and the current of the solar cell module become maximum, while changing the generated voltage V0 of the voltage source Vs.

According to the above-described configuration, as described above, in the power generation output voltage control circuit device, the switching unit, to which the control input is provided, is solely M1, and all other switching units used in the circuit configuration of the related art are replaced with the diodes. For this reason, the configuration of the device and the operation for control are simplified, and cost for preparing circuit elements is expected to be saved.

3. Modification Example of First Aspect

Figure 3A:
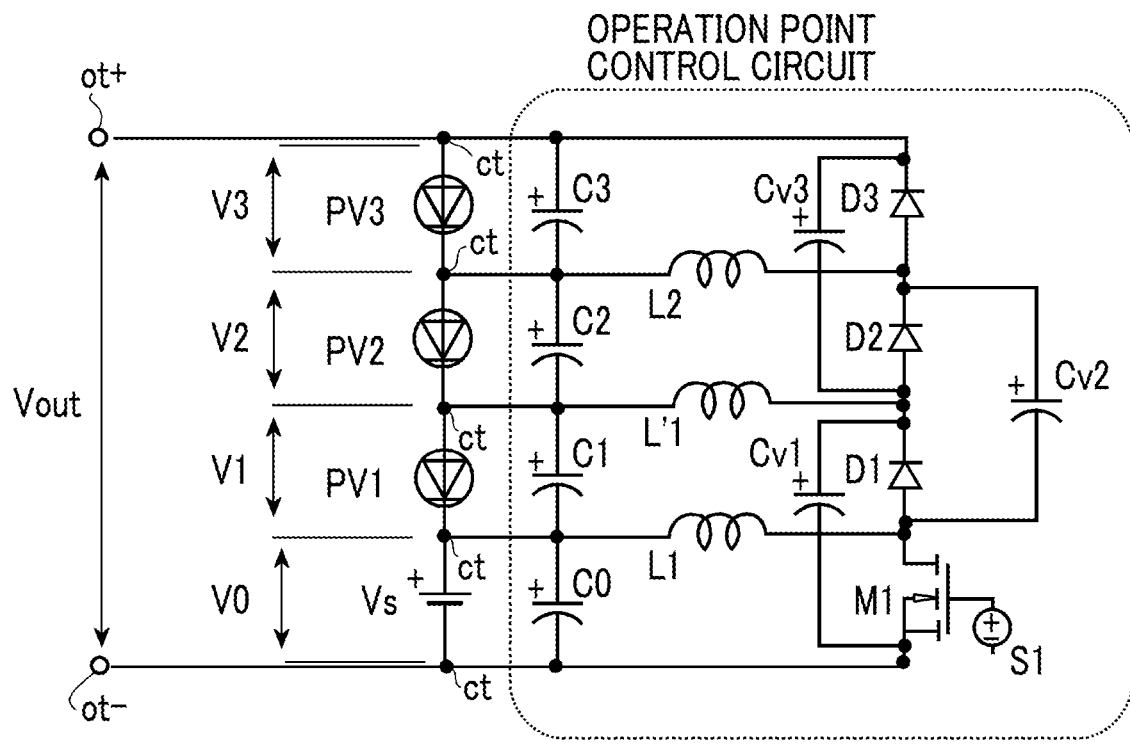
FIG. 3A is a circuit configuration diagram showing a modification example of the aspect of the solar power generation device constituted of the power generation output voltage control circuit device according to the disclosure and the 2k+1 solar cells.

In the configuration of the circuit of the first aspect illustrated in FIG. 1A described above, although the inductors are inserted between the negative electrodes of the odd-numbered cells counted from the negative electrode side of the column of the solar cells and the anodes of the diodes corresponding to the odd-numbered cells, as shown in FIG. 3A, as a further voltage generation unit, inductors (L'1 and the like) may also be inserted between the negative electrodes of the even-numbered cells counted from the negative electrode side of the column of the solar cells and the anodes of the diodes corresponding to the even-numbered cells. A generation direction of a voltage of each added inductor is opposite to the direction of the voltage of each of the inductors inserted between the negative electrodes of the odd-numbered cells counted from the negative electrode side of the column of the solar cells and the anodes of the diodes.

Figure 3B:
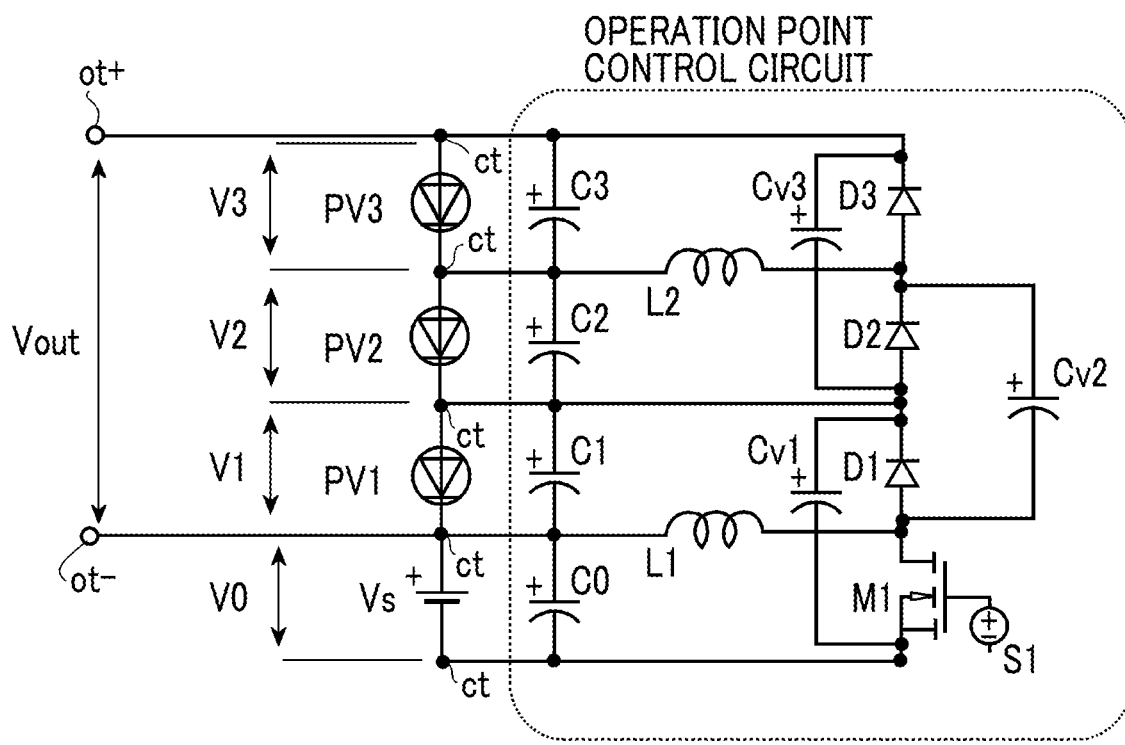
FIG. 3B is a circuit configuration diagram showing a modification example of the aspect of the solar power generation device constituted of the power generation output voltage control circuit device according to the disclosure and the 2k+1 solar cells.

In the configuration of the circuit of the first aspect, as shown in FIG. 3B, solely the column of the solar cells (PV1, PV2, PV3, . . . ) may be connected between the output terminals ot+, ot−, and the voltage source Vs may be connected outside between the output terminals ot+, ot−.

4. Configuration and Operation of Second Aspect

Figure 4:
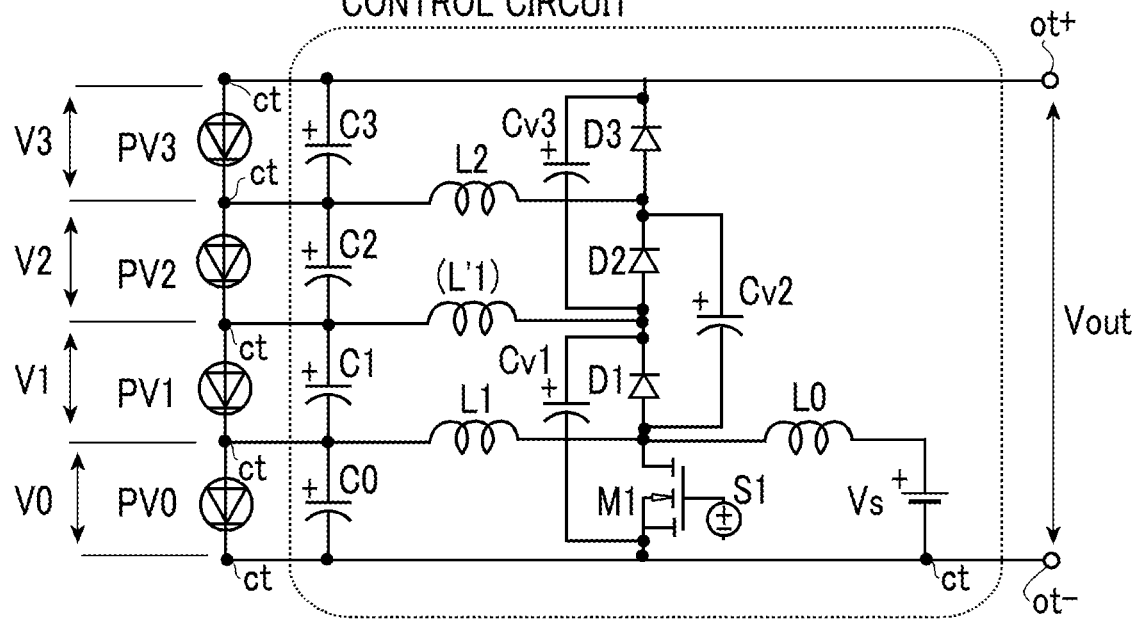
FIG. 4 is a circuit configuration diagram showing a second aspect of a solar power generation device constituted of the power generation output voltage control circuit device according to the embodiment and 2k+1 (in a case where k=1) solar cells.

Referring to FIG. 4, in the configuration of a second aspect of the embodiment, an additional solar cell PV0 is connected to a portion connected in series to the column of the solar cells, to which the voltage source Vs is connected, in the above-described first aspect, and the voltage source Vs is connected to a portion across the switching unit M1 from the additional solar cell PV0 through an inductor L0. That is, the voltage source Vs is connected in parallel to the additional solar cell PV0 across the inductors L1, L0. As further voltage generation units, inductors (L'1 and the like) may be inserted between the negative electrodes of the even-numbered cells PV2j counted from the negative electrode side of the column of the solar cells and the anodes of the diodes D2j corresponding to the even-numbered cells PV2j.

In the operation, as in the first aspect, in a case where switching of the ON and OFF of the switching unit M1 is repeatedly performed at the duty ratio d, a generated voltage of the additional solar cell PV0 becomes the same as the supply voltage V0 of the voltage source Vs according to the Kirchhoff's law. When the switching unit M1 is in the ON state, the generated voltage of the inductor L1 is generated in a direction from the switching unit M1 toward the solar cell PV0, and the magnitude of the generated voltage of the inductor L1 becomes the supply voltage V0 of the voltage source. When the switching unit M1 is in the OFF state, the direction of the generated voltage of the inductor L1 is inverted, and the magnitude of the generated voltage of the inductor L1 becomes $\alpha$V0. Then, while the direction of the generated voltage of the inductor L1 is cyclically inverted along with the ON and OFF switching operation of the switching unit M1, as in the above-described first aspect, the voltage $(1+\alpha)V0$ is held in each of the voltage holding capacitors Cvn. The generated voltages of the additional solar cell PV0 and the even-numbered solar cells PVn counted from the negative electrode side of the column of the solar cells coincide with the supply voltage V0 of the voltage source Vs evenly. The generated voltages of the odd-numbered solar cells PVn counted from the negative electrode side of the column of the solar cells coincide with $\alpha V0$ evenly. When the duty ratio $d=1/2$, the generated voltages Vn of the solar cells PVn coincide with the supply voltage V0 of the voltage source Vs evenly. An adjustment method of the supply voltage V0 of the voltage source Vs may be the same as in the first aspect.

In the above-described second aspect, the additional solar cell PV0 is added to the 2k+1 solar cells connected in series, the voltage and the power of the module, in which the 2k+2 solar cells in total are connected in series, are obtained, and the circuit is expected to be more effectively used.

5. Configuration and Operation of Third Aspect

Figure 5:
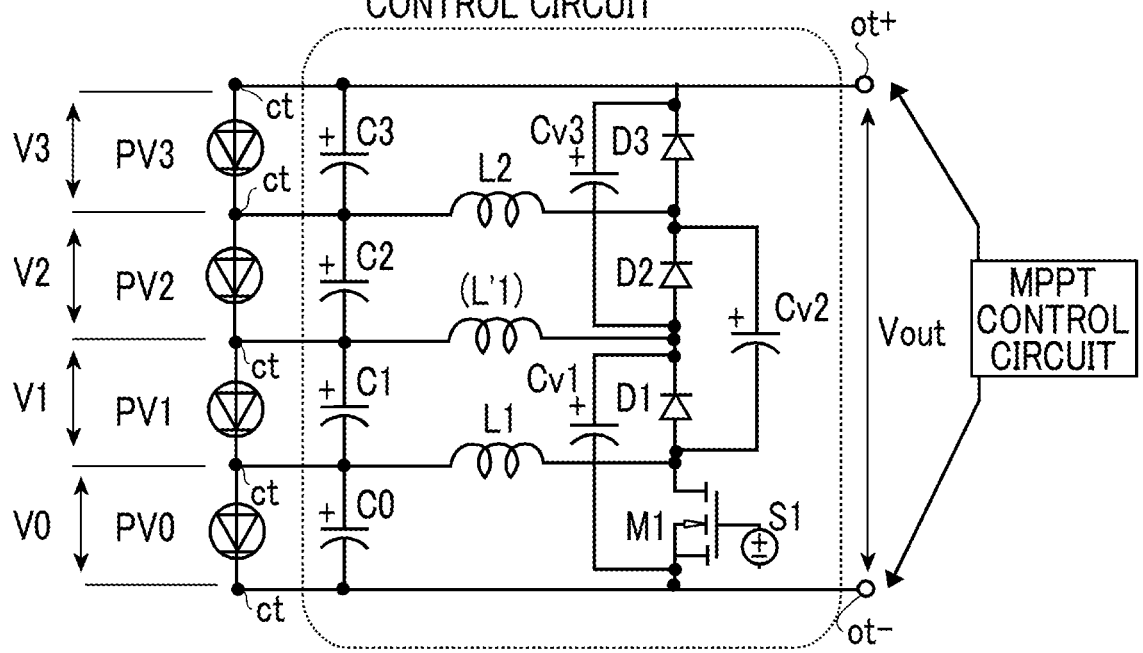
FIG. 5 is a circuit configuration diagram showing a third aspect of a solar power generation device constituted of the power generation output voltage control circuit device according to the embodiment and the 2k+1 (in a case where k=1) solar cells.

Referring to FIG. 5, in the configuration of a third aspect of the embodiment, the additional solar cell PV0 is connected to a portion connected in series to the column of the solar cells, to which the voltage source Vs is connected, in the above-described first aspect, and the output voltage between the output terminals is adjusted by any control device, for example, an MPPT control circuit. As further voltage generation units, the inductor (L'1 and the like) may be also inserted between the negative electrodes of the even-numbered cells PV2$j$ counted from the negative electrode side of the column of the solar cells and the anodes of the diodes D2$j$ corresponding to the even-numbered cells PV2$j$.

In the operation, as in the first aspect, in a case where switching of the ON and OFF of the switching unit M1 is repeatedly performed at the duty ratio d, when the switching unit M1 is in the ON state, the generated voltage of the inductor L1 is generated in a direction from the switching unit M1 toward the solar cell PV0, and the magnitude of the generated voltage of the inductor L1 becomes the same as the generated voltage V0 of the additional solar cell PV0. When the switching unit M1 is in the OFF state, the direction of the generated voltage of the inductor L1 is inverted, and the magnitude of the generated voltage of the inductor L1 becomes $\alpha V0$. Then, while the direction of the generated voltage of the inductor L1 is cyclically inverted along with the ON and OFF switching operation of the switching unit M1, as in the above-described first aspect, the voltage $(1+\alpha)V0$ is held in each of the voltage holding capacitor Cvn. The generated voltages of the additional solar cell PV0 and the even-numbered solar cells PVn counted from the negative electrode side of the column of the solar cells coincide with the supply voltage V0 of the voltage source Vs evenly. The generated voltages of the odd-numbered solar cells PVn counted from the negative electrode side of the column of the solar cells coincide with $\alpha V0$ evenly. Here, in this aspect, since an inter-output terminal voltage Vout is controlled, a relationship of Vout=$\Sigma$Vn=$(1+\alpha)(k+1)V0$ . . . (4) is established. The generated voltage V0 of the additional solar cell PV0 and the generated voltages Vn of the even-numbered solar cells PVn counted from the negative electrode side of the column of the solar cells are decided to Vn=Vout/{$(1+\alpha)(k+1)$} . . . (5a). The generated voltages Vn of the odd-numbered solar cells PVn counted from the negative electrode side of the column of the solar cells are decided to Vn=$\alpha$Vout/{$(1+\alpha)(k+1)$} . . . (5b). Here, when the duty ratio $d=1/2$, the generated voltages Vn of the solar cells PVn are decided evenly to Vn=Vout/2(k+1) . . . (5c). As in normal MPPT control, an adjustment method of the inter-output terminal voltage Vout may be achieved by measuring the output power, the voltage, and the current of the solar cell module and making the inter-output terminal voltage Vout coincide with a voltage, at which the output power, the voltage, and the current of the solar cell module become maximum, while changing the inter-output terminal voltage Vout.

In the above-described third aspect, the additional solar cell PV0 is added to the 2k+1 solar cells connected in series, the voltage and the power of the module, in which the 2k+2 solar cells in total are connected in series, are obtained, and the circuit is expected to be more effectively used. Since the inter-output terminal voltage Vout is controlled as in the normal MPPT control, in the operation point control circuit, it is advantageous in that there is no need to prepare the voltage source Vs (for example, an existing MPPT control device can be used).

6. Configuration and Operation of Fourth Aspect

Figure 6A:
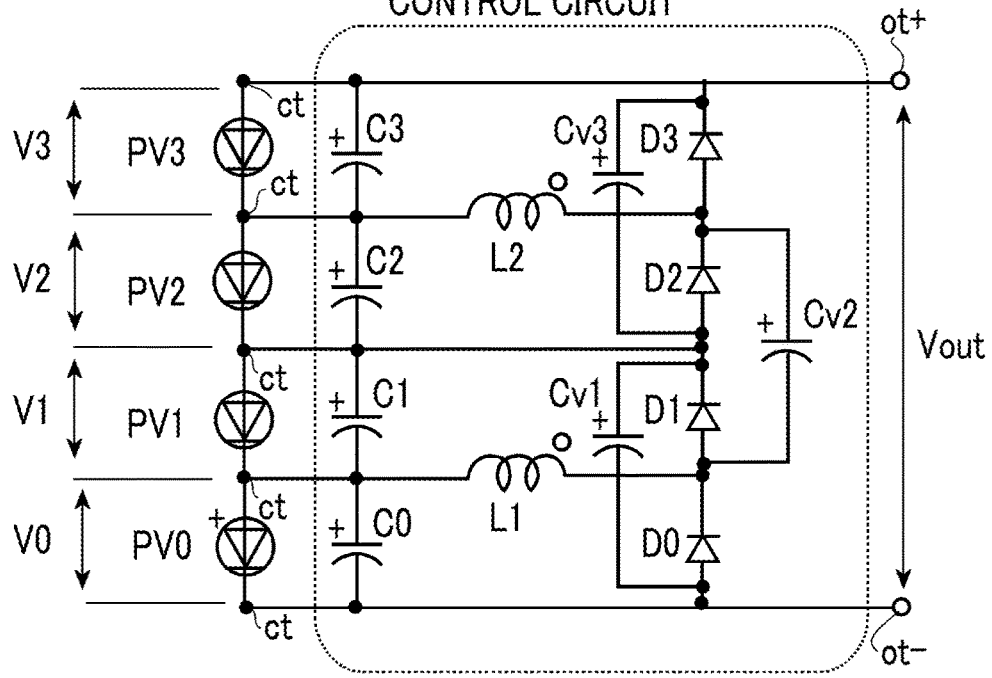
FIG. 6A is a circuit configuration diagram showing a fourth aspect of a solar power generation device constituted of the power generation output voltage control circuit device according to the embodiment and the 2k+1 (in a case where k=1) solar cells.

Referring to FIG. 6A, in the configuration of a fourth aspect of the embodiment, the additional solar cell PV0 is connected to a portion connected in series to the column of the solar cells, to which the voltage source Vs is connected, in the above-described first aspect, and an additional diode D0 is connected to a portion connected in series to the column of the diodes, to which the switching unit M1 is connected. The solar cell PV0 may be the same as the solar cells PVn in the column of the solar cells, and the diode D0 may be the same as the diodes Dn in the column of the diodes. Accordingly, in this aspect, a circuit in which the 2k+2 solar cells are connected in series and the 2k+2 diodes are connected in series corresponding to the 2k+2 solar cells is constituted.

Figure 6B:
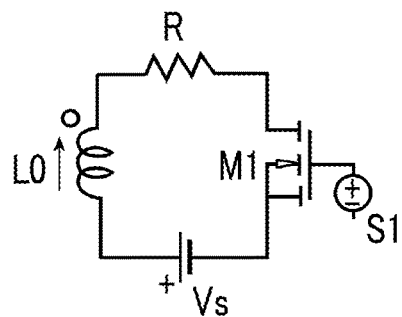
FIG. 6B is a circuit configuration diagram of a primary coil side of a transformer that generates a voltage in a secondary coil of the transformer to be used as a voltage generation unit in the circuit of FIG. 6A.

Then, a secondary coil of a transformer is used as a voltage generation unit in a portion where the inductor Lm is disposed in the circuit configuration of the first aspect. As illustrated in FIG. 6B, the secondary coil of the transformer is magnetically coupled to a primary coil in a primary coil circuit of the transformer through a magnetic circuit (not shown). The primary coil circuit of the transformer may be a circuit in which a primary coil L0, the voltage source Vs, the switching unit M1, and a resistor R form a closed loop. As the electrical conduction state and the cutoff state (ON state and OFF state) between both terminals of the switching unit M1 are cyclically switched, a current flowing from the voltage source Vs into the primary coil L0 is changed. With this, a magnetic flux that is generated in the primary coil L0 is changed, the change in magnetic flux is transmitted to the secondary coil Lm by way of the magnetic circuit, and electromotive force is generated in the secondary coil Lm. As schematically shown in FIG. 6B, the switching unit M1 receives, from the control input S1, the control signal in which the ON state and the OFF state are cyclically changed at any duty ratio d in a predetermined cycle time Ts, which may be discretionarily set. With this, when the control signal is ON, the electrical conduction state is brought between both terminals of the switching unit M1, and when the control signal is OFF, the cutoff state is brought between both terminals of the switching unit M1. As the voltage generation units, all secondary coils Lm connected to the negative electrodes of the odd-numbered solar cells counted from the negative electrode side of the column of the solar cells (excluding the additional solar cell) are disposed such that the directions are coincident (in the drawing, see o mark). As the transformer that is used in this aspect, any transformer in which a voltage in a range of a magnitude usable as the generated voltage of the solar cell is generated in the secondary coil, and a voltage can be inverted in a cycle requested as the voltage generation unit in the embodiment may be used.

Figure 6C:
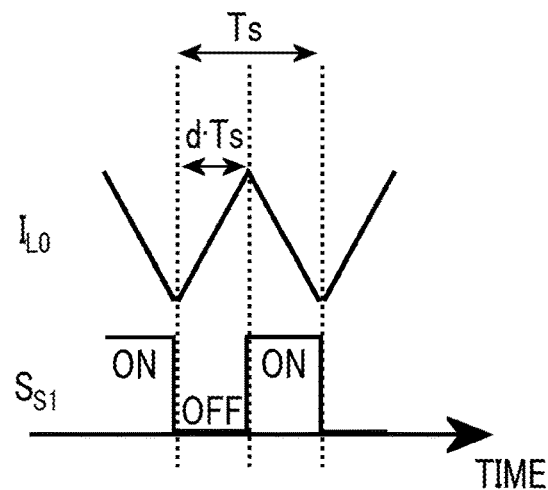
FIG. 6C shows temporal changes of a control signal $S_{s1}$ provided to the control input S1 of the switching unit for switching control of the electrical conduction state (ON) and the cutoff state (OFF) between both terminals of the switching unit and a ripple current $I_{L0}$ flowing in a primary coil L0 in a primary coil circuit of the transformer of FIG. 6B.

In the operation, as shown in a lower side of FIG. 6C, in a case where the ON state and the OFF state of the switching unit M1 is cyclically changed at the duty ratio d in the primary coil circuit of the transformer of FIG. 6B, as shown in an upper side of FIG. 6C, a ripple current flows into the primary coil, and electromotive force, which is cyclically inverted, is generated in the secondary coil. Here, when the switching unit M1 is in the ON state, in FIG. 6B, electromotive force is generated downward in the primary coil. With this, in the secondary coil Lm of FIG. 6A, electromotive force Vb is generated leftward, that is, in a direction from the column of the diodes toward the column of the solar cells. In this case, the generated voltages Vn of the additional solar cell PV0 and the even-numbered solar cells PVn counted from the negative electrode side of the column of the solar cells become the same as the generated voltage Vb of the secondary coil Lm according to the Kirchhoff's law. On the other hand, when the switching unit M1 is in the OFF state, in FIG. 6B, electromotive force is generated upward in the primary coil. With this, in the secondary coil Lm of FIG. 6A, electromotive force Va is generated rightward, that is, in a direction from the column of the solar cells toward the column of the diodes. In this case, since the odd-numbered diodes Dn counted from the negative electrode side of the column of the solar cells are in the electrical conduction state, the generated voltage Vn of the odd-numbered solar cells PVn counted from the negative electrode side of the column of the solar cells become the same as the generated voltage Va of the secondary coil Lm according to the Kirchhoff's law. Here, under a condition that electromagnetic energy stored in the primary coil L0 and the secondary coil Lm in the ON state of the switching unit M1 is discharged in the OFF state of the switching unit M1, the voltage Vb of the secondary coil Lm in the ON state of the switching unit M1 and the voltage Va of the secondary coil Lm in the OFF state of the switching unit M1 have a relationship of Vb:Va=(1−d):d. As a result, Va=αVb is established, and thus, the generated voltages Vn of the additional solar cell PV0 and the even-numbered solar cells PVn counted from the negative electrode side of the column of the solar cells are adjusted evenly to Vb. The generated voltages Vn of the odd-numbered solar cells PVn counted from the negative electrode side of the column of the solar cells are adjusted evenly to αVb. A difference in current among the respective solar cells PVn is absorbed by the voltage holding capacitors Cvn and the capacitors Cn (each of the voltage holding capacitors Cvn holds the voltage of (1+α)Vb). In addition, when the duty ratio d=1/2, the generated voltages Vn of the solar cells PVn become the same as the generated voltage Vb of the secondary coil Lm evenly. A relationship of L0:Lm=Vs:Vb is established between inductance of the primary coil and the secondary coil of the transformer and electromotive force. As a result, the generated voltages Vn of the solar cells PVn are provided by Vn=Lm/L0·Vs . . . (6) using a voltage source voltage Vs of the primary coil circuit.

In the above-described fourth aspect, a switching unit that needs a control input is not present in the circuit, in which the solar cells are connected in series, and the entire circuit is constituted of passive diodes. For this reason, there is no need to prepare a circuit that supplies a control input in the operation point control circuit, and a wiring structure in the circuit is simplified. Furthermore, since the operation voltage in a case where the 2k+2 power supply cells including a plurality of power supply cells and the additional power supply cell are connected in series is obtained between the output terminals, the circuit is expected to be more effectively used. In addition, the power supply is in the primary coil circuit of the transformer, and the solar cells are electrically insulated from the voltage source. For this reason, even in an environment in which the solar cell module and the power supply are not grounded in common, the circuit device can be used, and a situation in which the circuit device can be applied is expected to be expanded.

7. Modification Example of Fourth Aspect

Figure 7A:
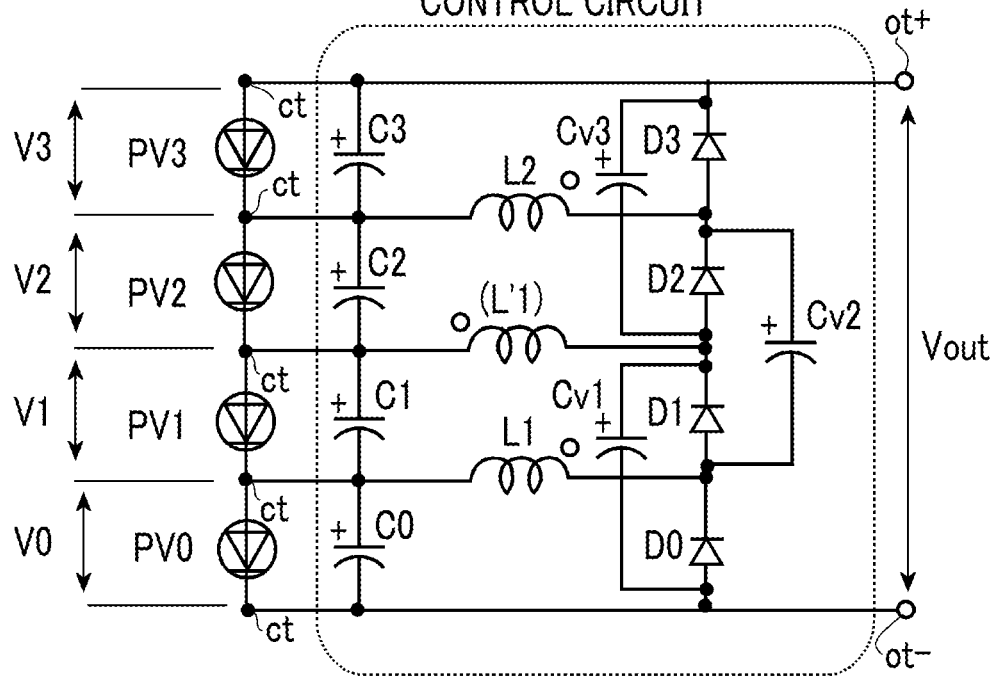
FIG. 7A is a circuit configuration diagram showing a modification example of the fourth aspect of a solar power generation device constituted of the power generation output voltage control circuit device according to the embodiment and 2k+1 (in a case where k=1) solar cells.

In the configuration of the above-described fourth aspect, as shown in FIG. 7A, as further voltage generation units, a secondary coil L'1 and the like may be inserted between the negative electrodes of the even-numbered cells PV2j counted from the negative electrode side of the column of the solar cells and the anodes of the diodes D2j corresponding to the even-numbered cells PV2j. In this case, the direction of electromotive force generated in the secondary coil L'1 and the like is set to be opposite to the direction of electromotive force of the secondary coils Lm connected to the negative electrodes of the odd-numbered cells PV2j−1 counted from the solar cell PV1 on the negative electrode side of the column of the solar cells. In this configuration, the primary coil circuit common to all secondary coils may be used. In this case, the number of parts of the device is suppressed small.

Figure 7B:
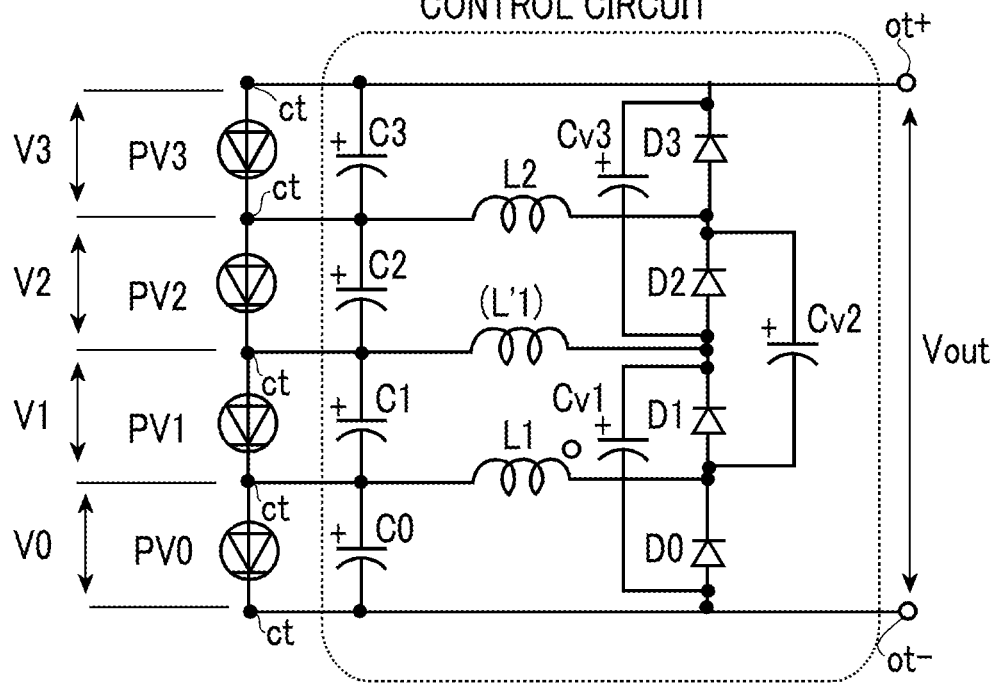
FIG. 7B is a circuit configuration diagram showing a modification example of the fourth aspect of a solar power generation device constituted of the power generation output voltage control circuit device according to the embodiment and 2k+1 (in a case where k=1) solar cells.

In the configuration of the above-described fourth aspect, as shown in FIG. 7B, all voltage generation units connected to the negative electrodes of the odd-numbered cells PV2j−1 counted from the solar cell PV1 other than the secondary coil L1 connected to the negative electrode of the solar cell PV1 may be inductors. As further voltage generation units, the inductors (L'1 and the like) may be inserted between the negative electrodes of the even-numbered cells PV2j counted from the negative electrode side of the column of the solar cells and the anodes of the diodes D2j corresponding to the even-numbered cells PV2j. In such a configuration, in a case where the generated voltage of the secondary coil L1 is cyclically inverted as described above, as in the first aspect, the generated voltages of the even-numbered cells counted from the negative electrode side of the column of the solar cells (excluding the additional solar cell PV0) coincide evenly with the voltage Vb of the secondary coil Lm when the switching unit M1 is in the ON state. The generated voltages of the odd-numbered cells counted from the negative electrode side of the column of the solar cells (excluding the additional solar cell PV0) coincide with αVb evenly. Then, when the ON state and the OFF state of the switching unit M1 of the primary coil circuit of the transformer are switched at regular intervals, that, when the duty ratio d:=1/2, α=1. Thus, the generated voltages of the solar cells PVn are provided by Expression (6). In this configuration, since the secondary coil of the transformer is used at one place in the operation point control circuit, power consumption needed for the operation of the circuit is reduced compared to the circuit of FIG. 6A.

Figure 8:
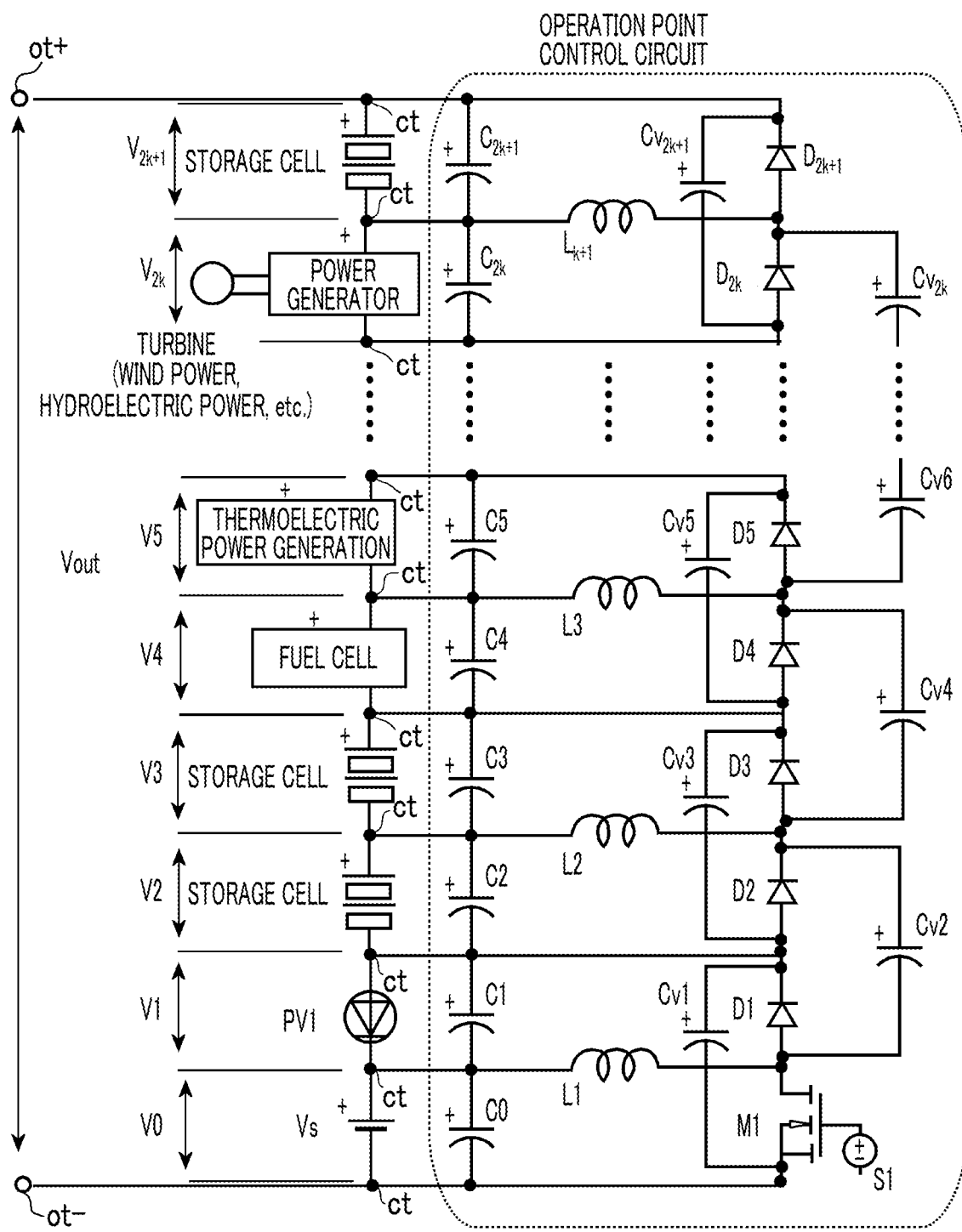
FIG. 8 is a circuit configuration diagram in a case where solar cells are replaced and any other power supply cells are connected in series in the output voltage control circuit device according to the embodiment.

Application of Output Voltage Control Circuit Device of Embodiment to Other Power Supply Elements As illustrated in FIG. 8, a series of configurations of at least one of the solar power generation device and the power generation output voltage control circuit device according to the embodiment described above may be applied to a case where any power supply cells, such as chemical cells, storage cells, fuel cells (or solid oxide type fuel cells), thermoelectric elements, or power generators (or any power generators using wind power, hydroelectric power, tidal power, an engine, or the like), other than the solar cell are connected in series. Even though the power supply cells connected in series are different in optimum operation voltage, in a case where a decrease in output due to the deviation of the operation voltage is not so large, the output voltage control circuit device is used according to the teaching of the embodiment, whereby it is possible to reduce time and effort for adjusting the operation voltage without significantly reducing the output. The configuration of the power generation output voltage control circuit device according to the above-described embodiment may be applied to a case where the power supply cells connected in series are of the same kind or different kinds. For example, in the output voltage control circuit device having the circuit configuration illustrated in FIG. 1A, 3A, 3B, 4, 5, 6A, 7A, or 7B, any power supply cells, such as chemical cells, storage cells, fuel cells, thermoelectric elements, or power generators, may be connected in series in place of the solar cell, and as illustrated in FIG. 8, different power supply cells may be used in a state connected in series.

In the output voltage control circuit device of the embodiment, in a case where the duty ratio of the switching unit is d, an operation voltage Vne of an even-numbered power supply cell and an operation voltage Vno of an odd-numbered power supply cell counted from the negative electrode side of the column of the power supply cells (excluding additional power supply cells) has a relationship of Vno=αVne . . . (7) using α=d/(1−d). For this reason, according to the embodiment, with the single output voltage control circuit device, in a module in which power supply cells of two power supply cells having different desired operation voltages are alternately connected in series, it is possible to adjust the operation voltages of the two groups of power supply cells to desired voltages, respectively, by adjusting the supply voltage of the voltage source Vs and the duty ratio d of the switching unit M1.

Although the above description has been made in connection with the embodiment of the disclosure, it will be apparent to those skilled in the art that many modifications and variations can be made and that the disclosure is limited solely to the illustrated embodiment and is applicable to various devices without departing from the concept of the disclosure.

What is claimed is:

1. An output voltage control circuit device for a plurality of power supply cells connected in series, the output voltage control circuit device comprising:
   a pair of output terminals;
   a plurality of electrode connection terminals connected to positive electrodes and negative electrodes of respective 2k+1 power supply cells, where k is a positive integer, having the positive electrodes and the negative electrodes connected in series between the output terminals;
   capacitors connected in parallel to the respective power supply cells through the corresponding electrode connection terminals between the output terminals;
   rectifying units connected in parallel to the respective power supply cells through the corresponding electrode connection terminals between the output terminals, each of the rectifying units having an anode connected to the electrode connection terminal on a negative electrode side of the power supply cell between the connected electrode connection terminals and a cathode connected to the electrode connection terminal on a positive electrode side of the power supply cell between the connected electrode connection terminals, and each of the rectifying units being configured to permit a flow of a current solely in a direction from the anode to the cathode in the rectifying unit;
   voltage generation units connected between the electrode connection terminals connected to a negative electrode side of odd-numbered power supply cells counted from the negative electrode side among the power supply cells and the anodes of the rectifying units corresponding to the odd-numbered power supply cells, each of the voltage generation units being configured such that a current is able to flow in both directions between both ends of the voltage generation unit, and to generate a voltage, which is cyclically inverted, between both ends;
   a voltage control circuit unit having a circuit line connected in parallel to a first voltage generation unit of the voltage generation units connected between the negative electrode of a first power supply cell counted from the negative electrode side among the power supply cells and the anode of the rectifying unit corresponding to the power supply cell, the voltage control circuit unit being configured to generate a voltage between both ends of the first voltage generation unit; and
   voltage holding capacitors connected in parallel between the circuit line and the cathode of the rectifying unit corresponding to the first power supply cell counted from the negative electrode side of the power supply cells among the rectifying units, between the anode of the rectifying unit corresponding to a 2j-th, where j is an integer of 1 to k, power supply cell counted from the negative electrode side of the power supply cells among the rectifying units and the cathode of the rectifying unit corresponding to a (2j+1)th power supply cell counted from the negative electrode side, and between the anode of the rectifying unit corresponding to a (2j−1)th power supply cell counted from the negative electrode side of the power supply cells among the rectifying units and the cathode of the rectifying unit corresponding to the 2j-th power supply cell,
   wherein the voltage control circuit unit is configured to generate a voltage, which has a magnitude discretionarily set and a direction of which is cyclically inverted, between both ends of the first voltage generation unit.

2. The device according to claim 1, wherein:
   each of the voltage generation units is an inductor;
   the voltage control circuit unit includes
      a voltage source having a negative electrode connected to the circuit line and a positive electrode connected to the electrode connection terminal connected to the negative electrode of the first power supply cell counted from the negative electrode side among the power supply cells, the voltage source being configured to generate a voltage having a magnitude discretionarily set between the positive electrode and the negative electrode,
      a capacitor connected in parallel to the voltage source, and
      a switching unit connected in parallel to the voltage source through the circuit line and the first voltage generation unit, the switching unit being configured to selectively provide electrical conduction between both terminals; and
   control is performed such that the switching unit repeatedly switches a state between both terminals between an electrical conduction state and a cutoff state cyclically.

3. The device according to claim 2, wherein the power supply cells and the voltage source are connected between the output terminals.

4. The device according to claim 2, wherein:
the power supply cells are connected between the output terminals; and
the voltage source is connected outside between the output terminals.

5. The device according to claim 1, wherein:
each of the voltage generation units is an inductor;
the voltage control circuit unit includes
- a voltage source having a negative electrode connected to the circuit line and a positive electrode connected to the anode of the rectifying unit corresponding to the first power supply cell counted from the negative electrode side among the power supply cells through the inductor, the voltage source being configured to generate the voltage having the magnitude discretionarily set between the positive electrode and the negative electrode,
- additional electrode connection terminals having a negative electrode connected to the circuit line and a positive electrode connected to the electrode connection terminal connected to the negative electrode of the first power supply cell counted from the negative electrode side among the power supply cells, the additional electrode connection terminals being connected to a positive electrode and a negative electrode of an additional power supply cell connected in series to the negative electrode side of the power supply cells,
- a capacitor connected in parallel to the additional power supply cell through the additional electrode connection terminals, and
- a switching unit connected in parallel to the voltage source between the circuit line and the anode of the rectifying unit corresponding to the first power supply cell counted from the negative electrode side among the power supply cells, the switching unit being configured to selectively provide electrical conduction between both terminals; and
control is performed such that the switching unit repeatedly switches a state between both terminals between an electrical conduction state and a cutoff state cyclically.

6. The device according to claim 5, wherein the power supply cells and the additional power supply cell are connected between the output terminals.

7. The device according to claim 1, wherein:
each of the voltage generation units is an inductor;
the voltage control circuit unit includes
- additional electrode connection terminals having a negative electrode connected to the circuit line and a positive electrode connected to the electrode connection terminal connected to the negative electrode of the first power supply cell counted from the negative electrode side among the power supply cells, the additional electrode connection terminals being connected to a positive electrode and a negative electrode of an additional power supply cell connected in series to the negative electrode side of the power supply cells, respectively,
- a capacitor connected in parallel to the additional power supply cell, and
- a switching unit connected in parallel to the additional power supply cell through the circuit line and the first voltage generation unit, the switching unit being configured to selectively provide electrical conduction between both terminals;
the power supply cells and the additional power supply cell are connected between the output terminals;
a device configured to control an output voltage is connected between the output terminals; and
control is performed such that the switching unit repeatedly switches a state between both terminals between an electrical conduction state and a cutoff state cyclically.

8. The device according to claim 2, wherein control is performed such that the switching unit repeatedly switches the state between both terminals between the electrical conduction state and the cutoff state cyclically at regular intervals.

9. The device according to claim 1, wherein:
the voltage control circuit unit includes a transformer having a primary coil and a secondary coil;
the first voltage generation unit is the secondary coil of the transformer; and
the transformer is a transformer that generates a voltage, which has a magnitude discretionarily set and a direction of which is cyclically inverted, between both ends of the secondary coil.

10. The device according to claim 9, wherein the voltage control circuit unit further includes
- additional electrode connection terminals having a negative electrode connected to the circuit line and a positive electrode connected to the electrode connection terminal connected to the negative electrode of the first power supply cell counted from the negative electrode side among the power supply cells, the additional electrode connection terminals being connected to a positive electrode and a negative electrode of an additional power supply cell connected in series to the negative electrode side of the power supply cells, respectively,
- a capacitor connected in parallel to the additional power supply cell through the electrode connection terminals, and
- an additional rectifying unit connected in series to the rectifying unit between the circuit line and the anode of the rectifying unit corresponding to the first power supply cell counted from the negative electrode side among the power supply cells.

11. The device according to claim 9, wherein:
another voltage generation unit other than the first voltage generation unit is the secondary coil of the transformer, and
a generated voltage of the other voltage generation unit is cyclically inverted in synchronization with the first voltage generation unit.

12. The device according to claim 9, wherein:
another voltage generation unit other than the first voltage generation unit is an inductor; and
a generated voltage of the other voltage generation unit is cyclically inverted in synchronization with the first voltage generation unit.

13. The device according to claim 1, wherein each of the power supply cells is at least one of a solar cell, a chemical cell, a fuel cell, a storage cell, a power generator, a thermoelectric element, and a combination of the cells.

14. The device according to claim 1, wherein the voltage control circuit unit is configured to generate a voltage, a direction of which is cyclically inverted at regular intervals and which has the same magnitude, between both ends of the first voltage generation unit.

15. The device according to claim 14, wherein:

each of the power supply cells is a solar cell; and the generated voltage between both ends of the first voltage generation unit is set to a generated voltage at a maximum power point of the power supply cell having a largest amount of received light among the power supply cells.

16. The device according to claim 1, wherein:

each of the power supply cells is a solar cell; and the generated voltage of the power supply cell having a largest amount of received light among the power supply cells is set to a generated voltage at a maximum power point of the power supply cell.

\* \* \* \* \*